United States Patent [19]

Stephens et al.

[11] Patent Number: 5,602,883
[45] Date of Patent: Feb. 11, 1997

[54] METHOD OF IMPLEMENTING DIGITAL PHASE-LOCKED LOOPS

[75] Inventors: Scott A. Stephens, South Pasadena; J. Brooks Thomas, La Canada, both of Calif.

[73] Assignee: The United States of America as represented by the Administrator of the National Aeronautics and Space Administration, Washington, D.C.

[21] Appl. No.: 141,797

[22] Filed: Oct. 13, 1993

[51] Int. Cl.[6] ........................................... H03D 3/24
[52] U.S. Cl. ........................................ 375/376; 327/150
[58] Field of Search .......................... 375/376; 327/150; 331/1 R, 25

[56] References Cited

U.S. PATENT DOCUMENTS

| | | | |
|---|---|---|---|
| 3,772,600 | 11/1973 | Natali | 327/98 |
| 4,426,712 | 1/1984 | Gorski-Popiel | 375/343 |
| 4,769,816 | 9/1988 | Hochstadt et al. | 370/105.3 |
| 4,771,250 | 9/1988 | Statman et al. | 331/17 |
| 4,794,341 | 12/1988 | Barton et al. | 329/304 |
| 4,820,993 | 4/1989 | Cohen et al. | 327/156 |
| 4,821,294 | 4/1989 | Thomas, Jr. | 375/343 |
| 4,890,305 | 12/1989 | Devries | 375/374 |
| 4,975,930 | 12/1990 | Shaw | 375/376 |
| 5,016,005 | 5/1991 | Shaw et al. | 340/870.19 |
| 5,036,296 | 7/1991 | Yoshida | 331/17 |
| 5,073,907 | 12/1991 | Thomas, Jr. | 375/376 |
| 5,109,394 | 4/1992 | Hjerpe et al. | 375/373 |
| 5,122,761 | 6/1992 | Wischermann | 331/1 A |

OTHER PUBLICATIONS

Statman, J. I., and Hurd, W. J., "An Estimator–Predictor Approach to PLL Filter Design", *IEEE Trans on Communications*, vol. 38, No. 10, Oct. 1990, pp. 1667–1669.

*Primary Examiner*—Stephen Chin
*Assistant Examiner*—Jeffrey W. Gluck
*Attorney, Agent, or Firm*—John H. Kusmiss

[57] ABSTRACT

In a new formulation for digital phase-locked loops, loop-filter constants are determined from loop roots that can each be selectively placed in the s-plane on the basis of a new set of parameters, each with simple and direct physical meaning in terms of loop noise bandwidth, root-specific decay rate, and root-specific damping. Loops of first to fourth order are treated in the continuous-update approximation ($B_L T \rightarrow 0$) and in a discrete-update formulation with arbitrary $B_L T$. Deficiencies of the continuous-update approximation in large-$B_L T$ applications are avoided in the new discrete-update formulation.

8 Claims, 17 Drawing Sheets

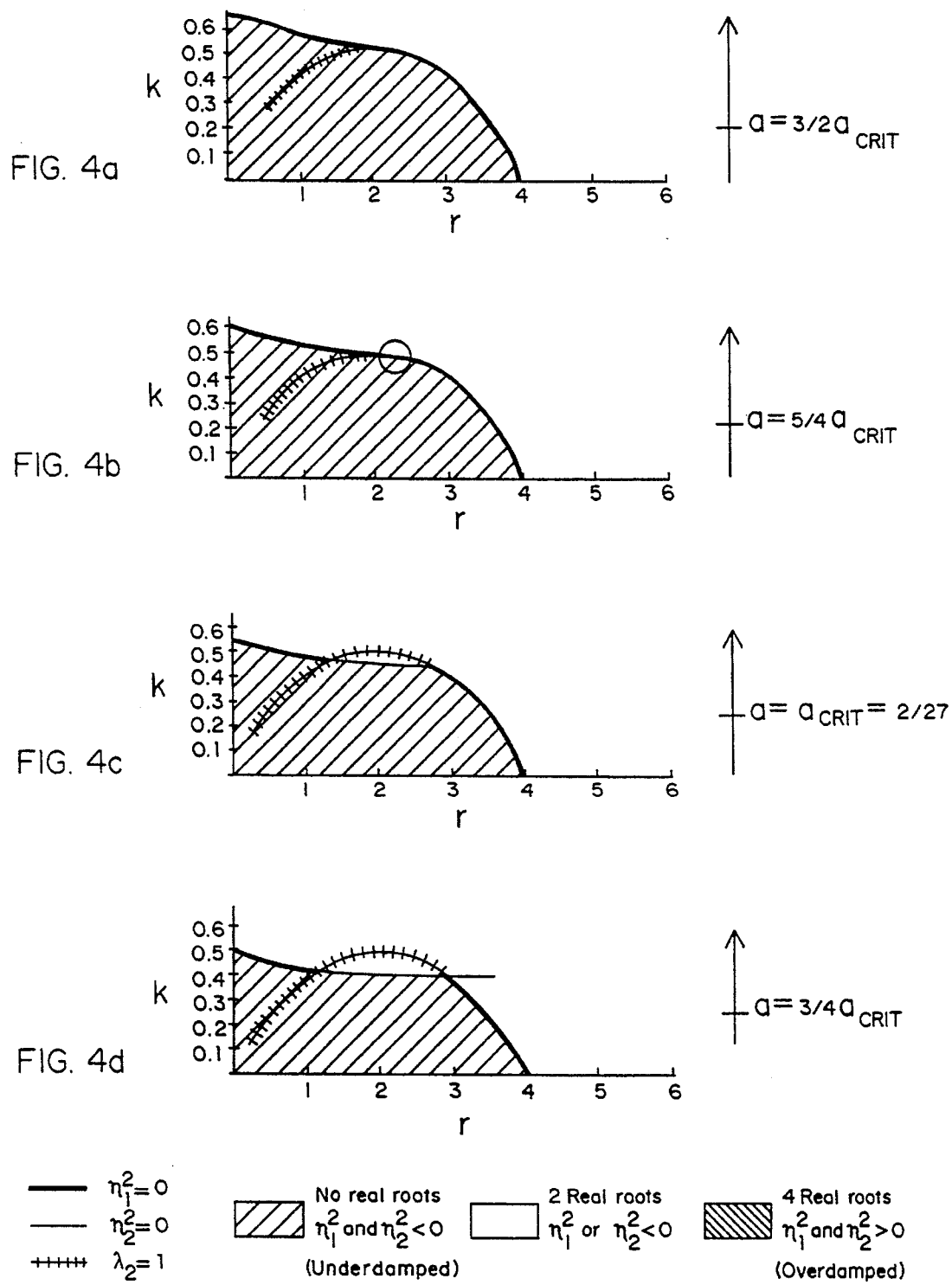

METHOD OF IMPLEMENTING DIGITAL PHASE-LOCKED LOOPS

ORIGIN OF INVENTION

The invention described herein was made in the performance of work under a NASA contract, and is subject to the provisions of Public Law 96-517 (35 USC 202) in which the Contractor has elected not to retain title.

TECHNICAL FIELD

The present invention comprises a method of implementation of a digital phase-locked loop with loop constants derived from roots placed in the s-plane on a root-by-root basis in terms of root-specific damping and root specific decay rates. The method provides improved flexibility in tailoring high-order loop performance and the design is more straightforward and understandable for high-order loops. The inventive method provides a fully digital formulation, free of analog complications. Further, loop bandwidth and damping do not change for high-gain loops.

BACKGROUND ART

It is desired to simplify and improve the design, analysis and synthesis of high-order digital phase-locked loops; to find a technique for selecting loop constants in high-gain loops in a manner that leads directly to desired damping and loop noise bandwidth.

Previous analyses of digital phase-locked loops (DPLLs) are based on the traditions of analog loops and introduce unnecessary analog considerations such as loop-filter time constants and uncontrolled gain variations. This reliance on analog tradition makes digital-loop analysis unnecessarily cumbersome and circuitous and impedes the progress of analysts with little analog training. Theory for digital loops can be rigorously developed from first principles without reference to analog concepts. With an appropriately formulated "digital analysis," one discovers that DPLL theory and design become more straightforward (particularly for third and fourth order loops) and that loop performance is more accurately controlled for "high gain" loops.

Previous analyses have begun with the closed-loop equation in the "continuous update" (CU) limit in which $B_L T \to 0$, where $B_L$ is the loop noise bandwidth and T is the loop update interval. For sufficiently small $B_L T$ (e.g., $B_L T \leq 0.02$), the CU approximation can provide an adequate starting point for loop analysis and design. When $B_L T$ is increased in this model to larger, "high-gain" values, however, loop roots can move away from their initial "small $B_L T$" paths in unplanned directions and the loop can diverge from expected behavior. For a loop with discrete update (DU) intervals, a solution to the loop equation can be developed in which root locations follow predetermined paths as a function of $B_L T$. This feature, which is an automatic benefit of a new controlled-root parameterization of the present invention, can provide, for example, supercritically-damped response for all allowed $B_L T$ values.

The following U.S. patent numbers were found in a search of relevant prior art but none is deemed to affect the patentability of the inventive method hereof.

U.S. Pat. No. 3,772,600 Natali
U.S. Pat. No. 4,426,712 Gorski-Popiel
U.S. Pat. No. 4,769,816 Hochstadt et al
U.S. Pat. No. 4,771,250 Statman et al
U.S. Pat. No. 4,794,341 Bartonetal
U.S. Pat. No. 4,820,993 Cohen et al
U.S. Pat. No. 4,821,294 Thomas, Jr.
U.S. Pat. No. 4,890,305 Devries
U.S. Pat. No. 4,975,930 Shaw
U.S. Pat. No. 5,016,005 Shaw et al
U.S. Pat. No. 5,036,296 Yoshida
U.S. Pat. No. 5,073,907 Thomas, Jr.
U.S. Pat. No. 5,109,394 Hjerpe et al
U.S. Pat. No. 5,122,761 Wischermann

STATEMENT OF THE INVENTION

The instant invention comprises an approach that reverses the conventional procedure of design for obtaining loop filter constants. The instant innovation is a method in which loop roots are first placed in the s-plane on the basis of new root-specific damping and root-specific-decay-rate parameters. Loop constants are then calculated on the basis of these roots.

In the present invention, loop-filter constants are specified in terms of new loop parameters. By design, each of these parameters has a simple and direct physical meaning in terms of a useful loop property: loop noise bandwidth, transient decay time or damping. For example, a simple choice of parameter values will automatically give a loop a particular selected loop bandwidth and supercritically-damped behavior (i.e., all roots real, negative, and equal). Thus, the need to solve for root location as a function of standard loop parameters (e.g., $B_L$, r and κ for a third-order loop) is eliminated and analysis is simplified. The new parameterization is made feasible in a practical sense by the fact that digital loops can usually be designed so that they do not suffer significantly from the effects of gain variations. That is, variations in signal amplitude, due to either gain instability or signal-power changes, can usually be accounted for by using a normalized phase extractor. So comprised, a "fully digital" DPLL does not require the analysis or precautions necessitated in other DPLL designs by potential gain variations. A particularly appealing benefit of the invention is the elimination of the equivocal practice of using the loop parameter r as both "damping factor" and an overall gain factor.

The analysis is extended to fourth-order loops because of the potential advantages of such loops. In some spacecraft applications, loop bandwidth can be set to a smaller value for a fourth-order loop than for a third order loop. Consequently, lower signal strengths can be reliably tracked. Fourth-order DPLLs, unlike their analog counterparts, are easy to design and implement, given the new fully-digital formulation. Accurate placement of loop roots results from a simple selection of parameters values rather than complicated analog circuit design.

To establish a foundation for analysis, a high-level description of a DPLL is presented by way of background. For loops of first to fourth order, the new controlled-root parameterization is used to derive a CU-limit solution and to develop a general approach from which numerical, controlled-root solutions to the DU loop can be derived. Solutions are given for phase and phase-rate feedback, with computation delay for closing the loop set to either zero or one update interval. To tie in with traditional analysis, the new loop parameters are related to old loop parameters in the CU limit. Loop transfer functions are presented for each loop order. The technique for direct transient-free acquisition is extended to fourth-order loops. Finally, results for two measures of loop performance, mean time to first cycle slip and steady-state phase error, are described.

OBJECTS OF THE INVENTION

It is therefore a principal object of the present invention to provide a method for specifying loop-filter constants of digital phase-locked loops in terms of loop parameters having direct physical meaning as a useful loop property.

It is another object of the invention to provide a method of simplifying the analysis of digital phase-locked loops by obviating the need to solve for root location as a function of standard loop parameters.

It is still an additional object of the present invention to provide a method for parameterizing digital phase-locked loops, wherein loop constants are computed on the basis of loop noise bandwidth and controlled-root independent parameters related to decay times and damping.

BRIEF DESCRIPTION OF THE DRAWINGS

The aforementioned objects and advantages of the present invention, as well as additional objects and advantages thereof, will be more fully understood hereinafter as a result of a detailed description of a preferred embodiment when taken in conjunction with the following drawings in which:

FIG. 6, comprising

FIG. 7, comprising

FIG. 8, comprising

FIG. 9, comprising

FIG. 10, comprising

FIGS. 12a and 12b, is a graphical illustration of mean time to first cycle slip for discrete-update loops with supercritical damping, phase and phase-rate feedback, no computation delay and sine phase extractor;

FIG. 13, comprising FIG. 14, comprising

1.0 DETAILED DESCRIPTION OF THE INVENTION

2.0 HIGH-LEVEL DESCRIPTION OF A DPLL

Figure 1:
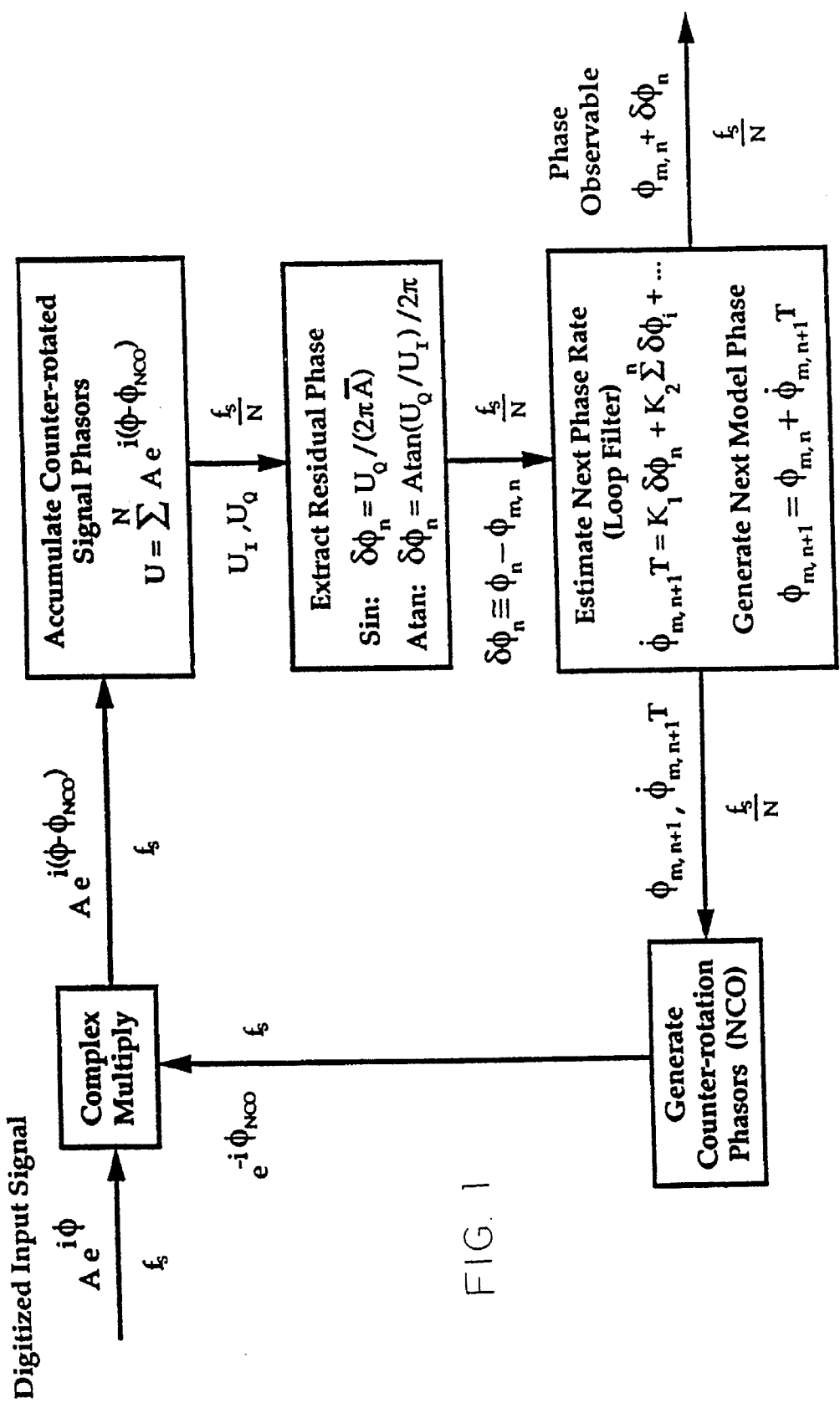
FIG. 1 is a block diagram of a digital phase-locked loop with phase and phase-rate updates.

The block diagram in FIG. 1 shows the basic elements of a DPLL. The example DPLL shown in FIG. 1 is based on "immediate update" of the loop filter and feedback of phase as well as phase-rate. Alternate DPLL designs might feedback only phase rate and/or have a substantial computation delay ("transport lag"). The analysis below also treats the case when the computation delay is equal to one update interval.

An incoming signal is sampled at a high rate ($f_s$) and then counter-rotated sample by sample with model phase values generated by a number-controlled oscillator (NCO) as directed by loop feedback. The resulting counter-rotated signal, which should have very low frequency, is then accumulated over an update interval length T. A phase extractor then processes the resulting complex sum to produce a value for residual phase for the given interval (nth). For an ideal phase extractor, the $n^{th}$ residual phase is equivalent to the difference of the $n^{th}$ input signal phase $\phi_n$ and the $n^{th}$ model phase $\phi_{m,n}$:

$$\delta\phi_n = \phi_n - \phi m,n \qquad (2.1)$$

with each reference to the center of the sum interval. Even though actual residual phase can deviate from this linear model due to nonlinearity in the phase extractor and/or cycle ambiguities, the theory presented here will be based on the approximation of Equation (2.1). This $n^{th}$ residual phase is immediately passed to the loop filter to assist in the prediction of the phase rate for the $(n+1)^{th}$ interval. The loop filter generates an estimate of phase rate, $\dot{\phi}_{m,n+1}$ T, in the form of phase change per update interval. An estimate of the next model phase, the $(n+1)^{th}$, is projected ahead to interval center by adding this estimate phase change to the previous $n^{th}$ model phase:

$$\phi_{m,n+1} = \phi_{m,n} + \dot{\phi}_{m,n+1} T \qquad (2.2)$$

The $(n+1)^{th}$ model phase, along with estimated phase rate, is used to initialize the phase and rate registers of the NCO in a manner that causes the NCO to produce over the $(n+1)^{th}$ interval, phase values characterized by said rate and center-interval phase. In this manner, the loop is closed and a new value for residual phase is produced to repeat the process.

3.0 LOOP THEORY

3.1 LOOP FILTER

As suggested above, residual phase from a given interval can either immediately enter the loop filter and influence feedback in the very next interval or its effect can be delayed to allow more time for computation. Two cases are considered here: a) "immediate" updates with acceptably small computation times and b) updates delayed by one update interval. Immediate updates are discussed first.

The use of residual phase from a given interval to update NCO phase in the very next interval can lead to a "dead time" during which necessary update computations are performed, and during which no counter-rotated phasors are accumulated. If the length of this "dead time" can be made such a small fraction of an update interval that the SNR loss is acceptably small, the immediate update of the loop filter becomes feasible. For immediate updates, an $N^{th}$-order digital loop filter, using residual phase values $\delta\phi_i$ up to and including the $n^{th}$ sum interval, estimates phase rate for the $(n+1)^{th}$ interval according to $$\dot{\phi}_{m,n+1}T = K_1\delta\phi_n + K_2 \sum_{i=1}^{n} \delta\phi_i + K_s \sum_{i=1}^{n}\sum_{j=1}^{i} \delta\phi_j + \quad (3.1)$$

$$K_4 \sum_{i=1}^{n}\sum_{j=1}^{i}\sum_{k=1}^{i} \delta\phi_k + \ldots$$

where $\dot{\phi}_{m,n+1}T$ is phase change per update interval T and the loop constants $K_i$ are to be specified below. (An $N^{th}$-order loop has N terms.)

In the case of a relatively long computation time, loss of data can often be eliminated by performing filter computations in parallel with signal accumulation in each update interval, and applying the result one interval later than the immediate-update approach. For a computation delay ("transport lag") of one update interval, the loop filter estimates phase rate by computing during the $n^{th}$ interval the expression $$\dot{\phi}_{m,n+1}T = K_1\delta\phi_{n-1} + K_2 \sum_{i=1}^{n-1} \delta\phi_i + K_s \sum_{i=1}^{n-1}\sum_{j=1}^{i} \delta\phi_j + \quad (3.2)$$

$$K_4 \sum_{i=1}^{n-1}\sum_{j=1}^{i}\sum_{k=1}^{i} \delta\phi_k + \ldots$$

Note that the only change between Equations (3.1) and (3.2) is that the $n^{th}$ residual phase is not used in computing the $(n+1)^{th}$ phase-rate estimate.

In the following discussion, the loop equation will be solved on the basis of immediate updates Equation (3.1), while only results are presented for Equation (3.2).

3.2 CONTINUOUS-UPDATE LIMIT

3.2.1 LOOP EQUATION

In many applications, the update interval T is much shorter than all other filter time scales, and considerable insight may be gained by writing Equation (3.1) in the "continuous-update limit", $T\to 0$. (One can easily show that Equation (3.2) leads to the same result in this limit.) To facilitate this, define new loop constants $\kappa_i$ as $$K_i = \kappa_i T^i \text{ for } i=1, N \quad (3.3)$$

so that Equation (3.1) becomes $$\frac{\phi_{m,n+1} - \phi_{m,n}}{T} = \kappa_1\delta\phi_n + \kappa_2 \sum_{i=1}^{n} T\delta\phi_i + \quad (3.4)$$

-continued $$+ \kappa_3 \sum_{i=1}^{n} T \sum_{j=1}^{i} T\delta\phi_j + \kappa_4 \sum_{i=1}^{n} T \sum_{j=1}^{i} T \sum_{k=1}^{i} T\delta\phi_k + \ldots$$

where estimated phase rate has been rewritten on the basis of Equation (2.2) under the assumption that the NCO is updated in both phase and phase rate. In the limit $T\to 0$, the first term becomes a derivative and the sums become integrals:

$$\frac{d}{dt}\phi_m = \kappa_1\delta\phi + \kappa_2 \int_{t_0}^{t} dt\delta\phi + \kappa_3 \int_{t'}^{t}\int_{t_0}^{t'} d^2t\delta\phi + \quad (3.5)$$

$$\kappa_4 \int_{t'}^{t}\int_{t''}^{t'}\int_{t_0}^{t''} d^3t\delta\phi + \ldots$$

Thus, in this limit, the basic equation governing "NCO rate" is the same equation that governs the VCO rate of an analog loop, given perfect integrators.

Solutions of the closed-loop equation can be used on the theory of differential equations after substituting Equation (2.1) and differentiating N−1 times:

$$\frac{d^N}{dt^N}\phi_m = \kappa_1\frac{d^{N-1}}{dt^{N-1}}\phi_m + \kappa_2\frac{d^{N-2}}{dt^{N-2}}\phi_m + \ldots + \kappa_N\phi_m = \quad (3.6)$$

$$\kappa_1\frac{d^{N-1}}{dt^{N-1}}\phi + \kappa_2\frac{d^{N-2}}{dt^{N-2}}\phi + \ldots + \kappa_N\phi$$

Solution of this differential equation will give the behavior of model phase $\phi_m$ in response to input phase $\phi$.

3.2.2 TRANSFER FUNCTION AND LOOP NOISE BANDWIDTH

To find the frequency response of the loop, take the Fourier transform of both sides of Equation (3.6), and utilize the relation $$F\left\{\frac{d^n\phi(t)}{dt^n}\right\} = (i2\pi v)^n F\{\phi(t)\} \quad (3.7)$$

where $F\{\}$ represents a Fourier transform. This produces $$[(i2\pi v)^N + \kappa_1(i2\pi v)^{N-1} + \kappa_2(i2\pi v)^{N-2} + \ldots + \kappa_N]\phi_m(v) = [\kappa_1(i2\pi v)^{N-1} + \kappa_2(i2\pi\kappa)^{N-2} + \ldots + \kappa_N]\phi(v) \quad (3.8)$$

where $\phi(v)$ and $\phi_m(v)$ are the Fourier transforms of $\phi(t)$ and $\phi_m(t)$. The closed-loop transfer function $H(v)$ is defined by $\phi_m(v) = H(v)\phi(v)$, so we have $$H(v) = \frac{\kappa_1(i2\pi v)^{N-1} + \kappa_2(i2\pi v)^{N-2} + \ldots + \kappa_N}{(i2\pi v)^N + \kappa_1(i2\pi v)^{N-1} + \kappa_2(i2\pi v)^{N-2} + \ldots + \kappa_N} \quad (3.9)$$

Plots of the transfer function for various loop orders and constants are shown in FIGS. 7 to 10. The single-sided loop noise bandwidth $B_L$ for the closed loop is defined by $$2B_L \equiv \int_{-\infty}^{\infty} dv|H(v)|^2 \quad (3.10)$$

This integral is evaluated in Appendix A to find $B_L$ as a function of $\kappa_1, \kappa_2, \ldots$ continuous-update limit and the results are summarized in Table 3-1 for loop fourth order.

3.2.3 PARAMETERIZATION OF LOOP CONSTANTS

Loop bandwidth $B_L$ provides us with one parameter for parameterizing the loop constants. Conventional loop theory specifies additional parameters at this point (e.g., r, κ, ...) to complete the parameterization. However, since r, κ, etc. can not be given direct physical significance for loops higher than second order, they are less useful than more carefully chosen parameters.

To begin the process of defining new parameters, define the higher κ's in terms of $\kappa_1$:

$$\kappa_i = \alpha_i \kappa_1^i \text{ for } i=2,N \tag{3.11}$$

No loss of generality is suffered at this step since three new parameters replace the three κ's. When this equation is substituted for the κ's in the expression for loop bandwidth, one obtains $B_L$ as a function of the α's, as shown in Table 3-1. This equation can be solved for $\kappa_1$ in terms of $B_L$ and the α's, as shown by the first line of equations for each loop order in Table 3-2. Based on this expression for $\kappa_1$ and Equation (3.11), the loop constants can be expressed as a function of $B_L$ and the α's.

The variables $\alpha_2, \ldots, \alpha_N$, will now be parameterized in terms of physically significant quantities. To begin the search for such parameters, return to Equation (3.6). When the roots are unequal (i.e., non-degenerate), the general solution to the homogeneous equation ($\phi(t)=0$) is of the form $$\phi_m(t) = \sum_{i=1}^{N} a_i e^{s_i t} \tag{3.12}$$

where each $s_i$ is a root of the characteristic equation $$s^N + \kappa_1 s^{N-1} + \kappa_2 s^{N-2} + \ldots + \kappa_N = 0 \tag{3.13}$$

and where the $a_i$ are amplitudes to be determined by the initial conditions. We can use characteristics of these roots to parameterize $\kappa_1, \kappa_2, \ldots, \kappa_N$, so as to create a more physically interpretable representation.

Since the loop constants $\kappa_1$ are real, we can parameterize the roots without loss of generality as $$\{s_1, s_2, s_3, s_4, s_5, s_6; \ldots\} = \{-\beta_1(1\pm\eta_1); -\beta_2(1\pm\eta_2); -\beta_3(1\pm\eta_3); \ldots\} \tag{3.14}$$

where $\eta_i^2$ and $\beta_i$ are real. For an odd number of roots, the unpaired root is not given an $\eta^2$ parameter. This parameterization takes advantage of the fact that complex roots of a polynomial equation always occur in conjugate pairs when the polynomial coefficients are real. Our goal here is to create parameters which dictate the relative behavior of the roots once $B_L$ has been specified. Thus we can choose one root factor, $\beta_1$, as the reference decay-rate parameter, which is to be determined below as a function of $B_L$, and form new parameters $\lambda_i$ which indicate magnitude relative to the first:

$$\beta_i = \lambda_i \beta_1 \text{ for } i \geq 2 \tag{3.15}$$

Our root parameterization is now given by:

$$\{s_1, s_2; s_3, s_4; s_5, s_6; \ldots\} = \{-\beta_1(1\pm\eta_1); -\beta_1\lambda_2(1\pm\eta_2); -\beta_1\lambda_3(1\pm\eta_3); \ldots\} \tag{3.16}$$

The overall scale factor $\beta_1$, which we choose to be a positive real number for loop stability, is proportional to $B_L$ in the CU limit, as can be inferred from the specific example in Section 3.2.4.

The $\eta_i^2$, which we will refer to as the damping parameters, contain useful information about each root pair. The sign of $\eta_i^2$ for a given root pair determines the damping behavior for that root pair:

$\eta_i^2 > 0$ two real roots; overdamped $\eta_i^2 = 0$ two real, equal roots: critically dampened $\eta_i^2 < 0$ complex conjugate pair: underdamped/oscillatory and the magnitude of $\eta_i^2$ is a measure of the separation of the root pair:

$$\left|\frac{s_+ - s_-}{s_+ + s_-}\right| = |\eta_i| \tag{3.17}$$

The $\lambda_i$'s, which we will refer to as the relative magnitude parameters, control the relative magnitudes of different root pairs. Furthermore, a negative (positive) $\lambda_1$ for a given root indicates an exponentially growing (decaying) solution to (3.6), since $\beta_1$ is chosen to be a positive real value. Some interesting values of $\lambda$'s and $\eta$'s are:

all $\lambda_i=1$ all real parts of roots equal all $\eta_i^2=0$, $\lambda_i=1$ all roots real and equal (supercritically damped)

all $\eta_i^2=-1$, $\lambda_i=1$ "standard" underdamped response where "standard" underdamped response for a given root corresponds to the response of a $2^{nd}$-order loop with $r=2(\zeta=0.707)$.

To express the κ's as a function of these new root parameters, equate each term in Equation (3.13) with the like term in the same polynominal factored into its roots:

$$(s-s_1)(s-s_2) \ldots (s-s_n) = 0 \tag{3.18}$$

The κ's are then given by $$\kappa_1 = -\sum_i^N s_i \tag{3.19}$$

$$\kappa_2 = +\sum_{i<j}^N s_i s_j \tag{3.20}$$

$$\kappa_3 = -\sum_{i<j<k}^N s_i s_j s_k \tag{3.21}$$

.
.
.

$$\kappa_N = (-1)^N (s_1 s_2 s_3 \ldots s_N) \tag{3.22}$$

Figure 2:
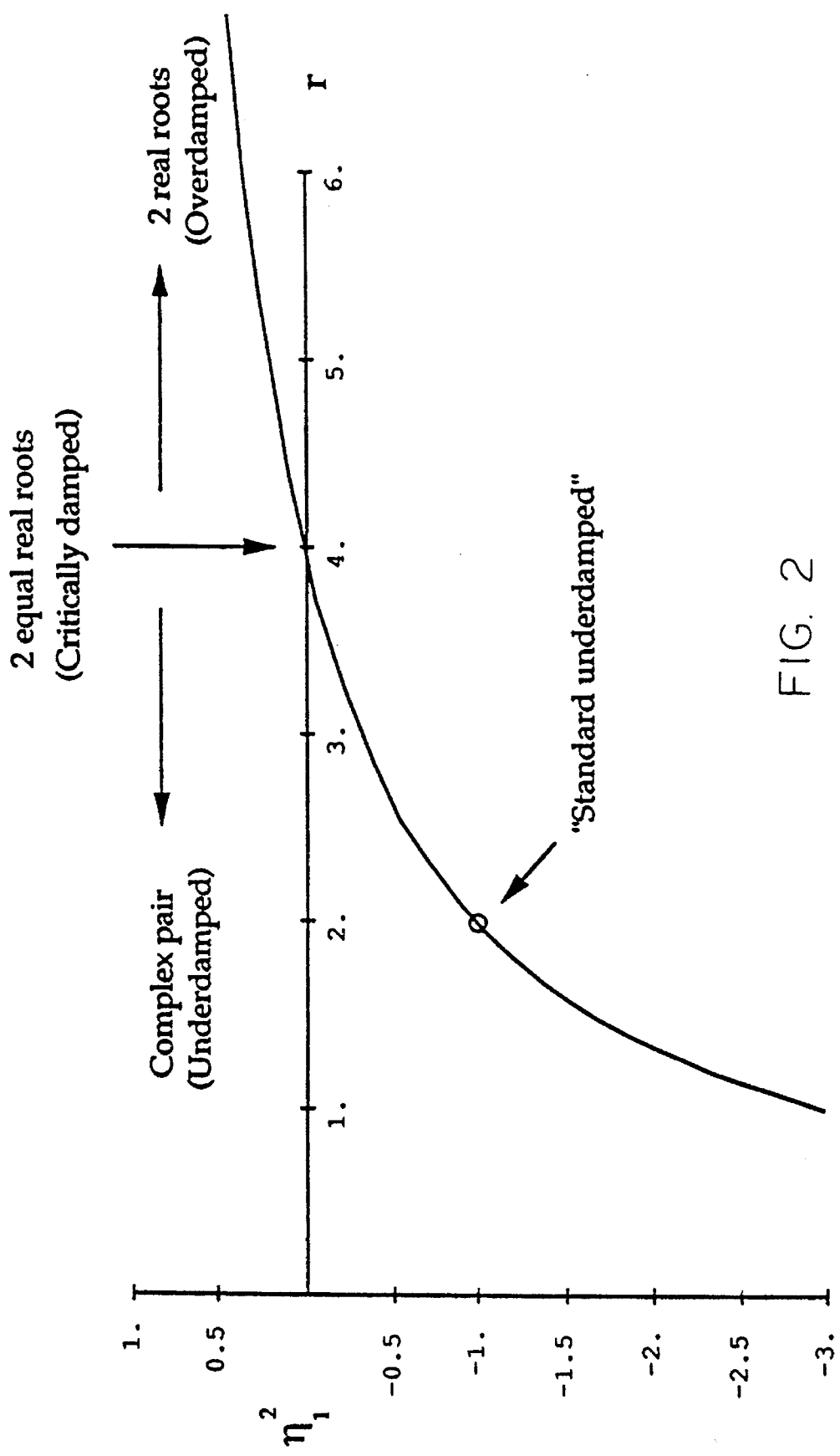
FIG. 2 is a graphical illustration of the relation between the conventional second-order loop filter parameter r and the controlled-root parameter $\eta_1^1$ in the continuous update limit.
Figure 3:
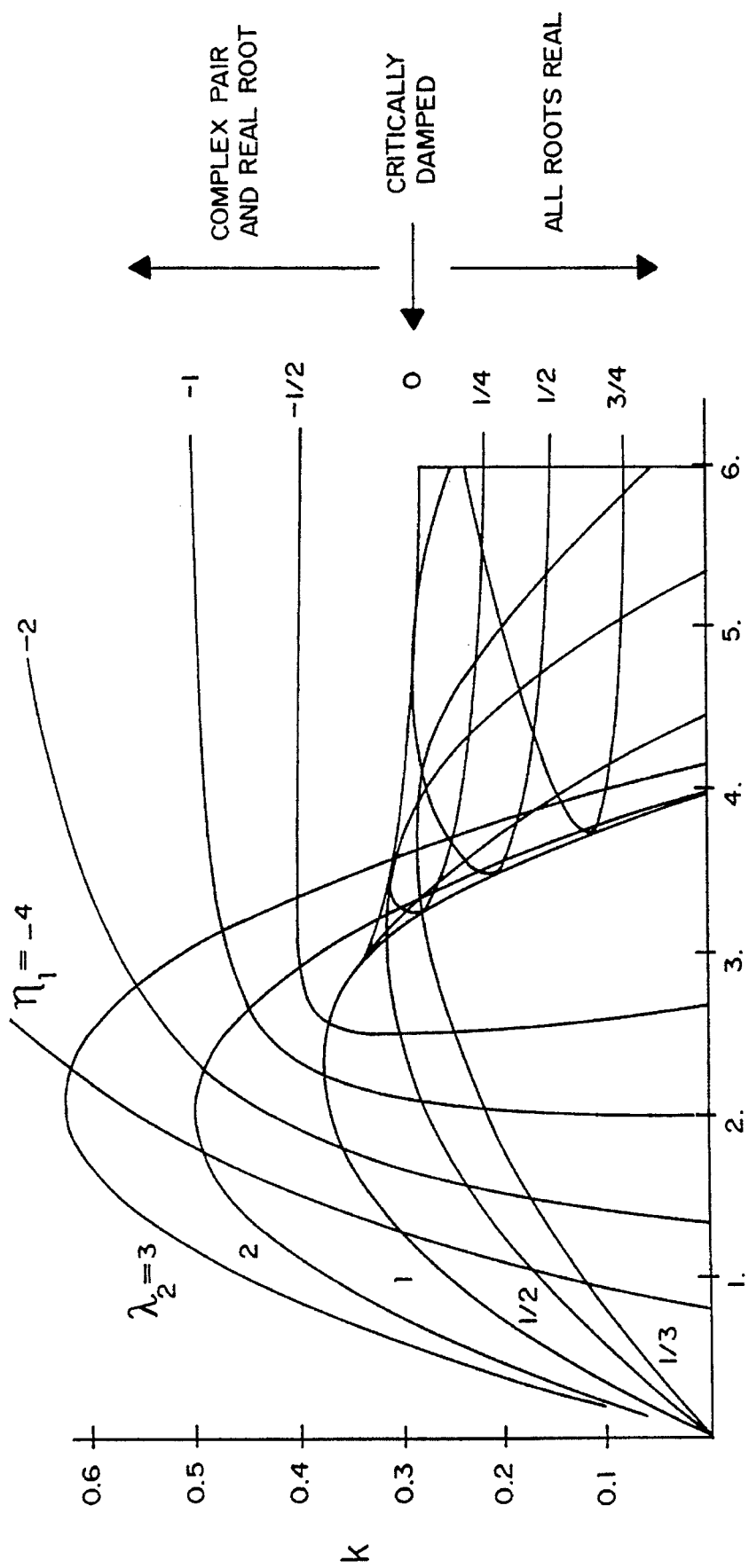
FIG. 3 is a graphical illustration of relations between third-order loop filter parameters r, κ and controlled-root parameters $\eta_1$ $\lambda_2$ in the continuous update limit with the shaded area representing values of r, κ where all roots are real.
Figure 4E:
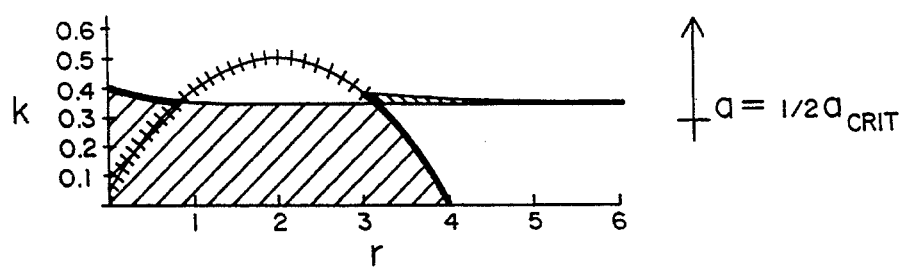
FIG. 4 is a graphical illustration of the relationship between fourth-order loop filter parameters r, κ, a and controlled-root parameters $\eta_1$, $\lambda_2$, $\eta_2$ in the continuous update limit.
Figure 4F:
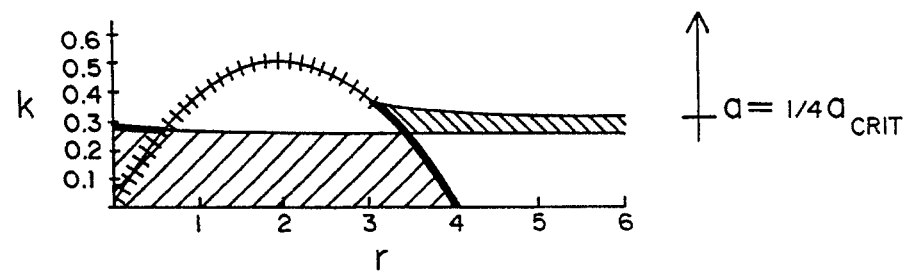
Figure 4G:
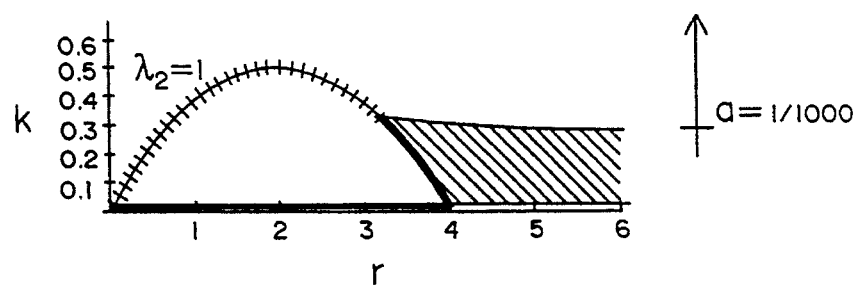
Figure 5A:
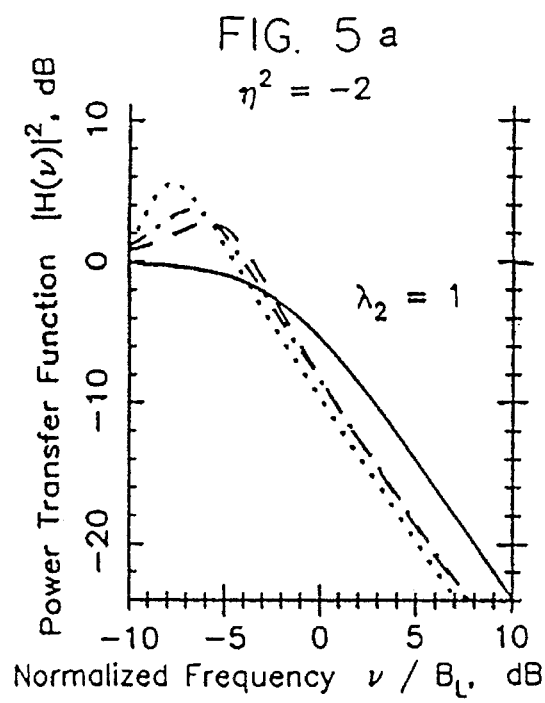
FIG. 5 is a graphical illustration of transfer functions for loops of order 1 to 4 for various values of $\eta^2$ and $\lambda_2$.
Figure 5B:
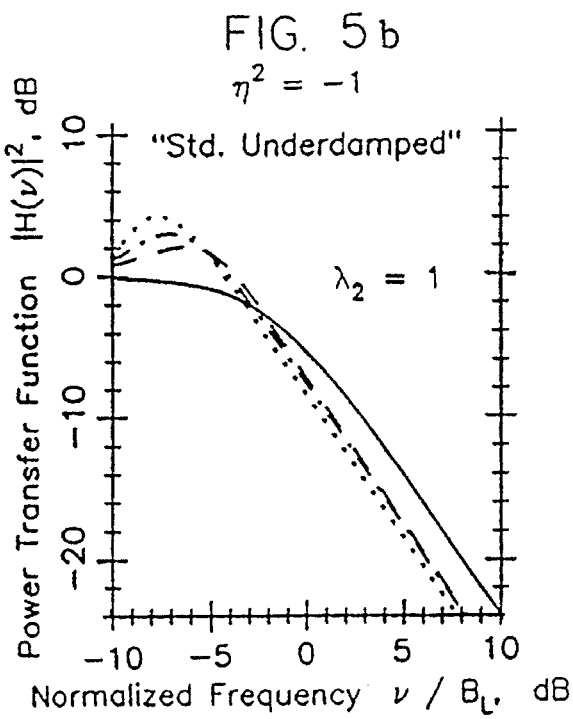
Figure 5C:
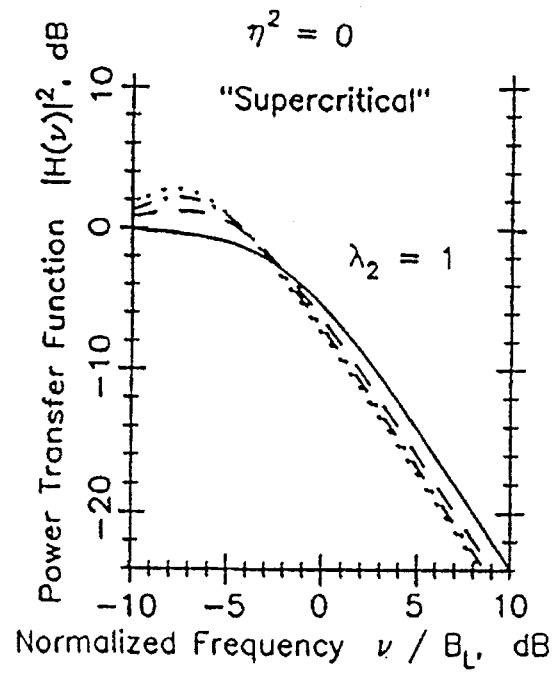
Figure 5D:
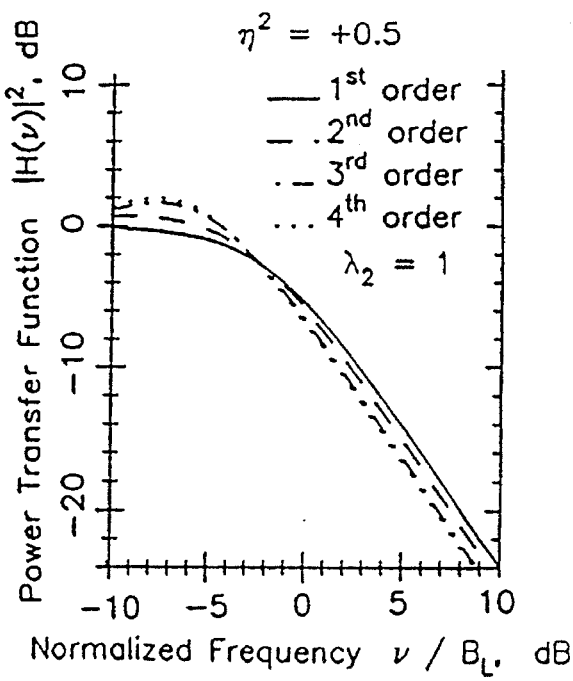
Figure 5E:
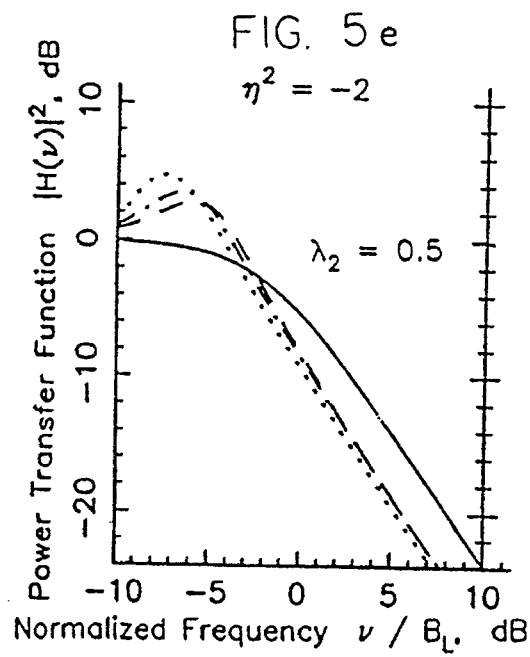
Figure 5F:
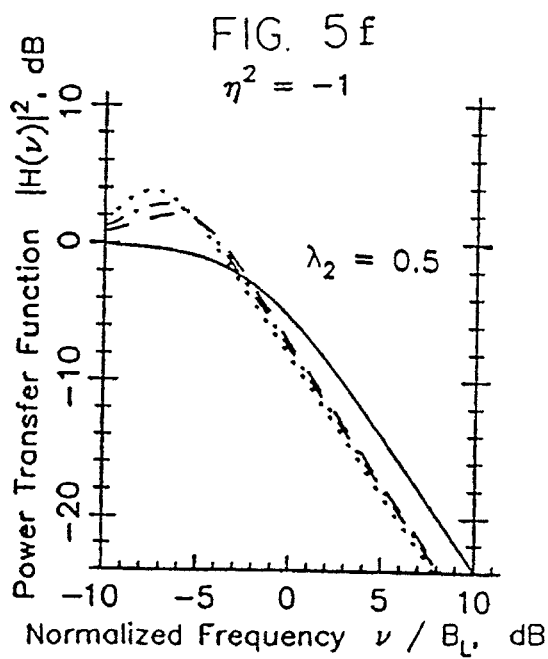
Figure 5G:
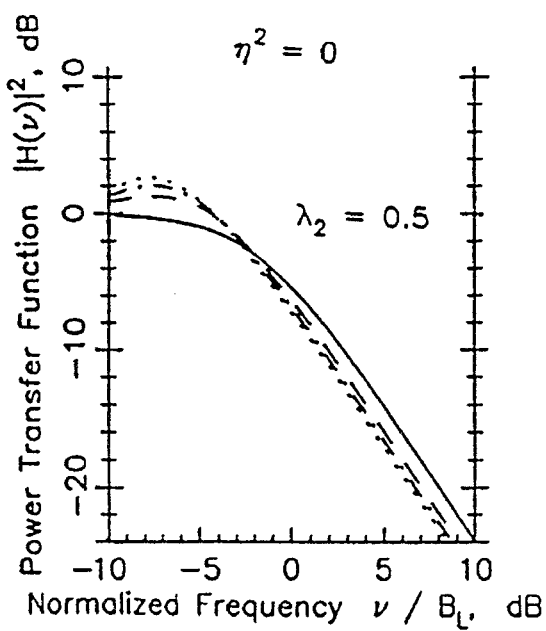
Figure 5H:
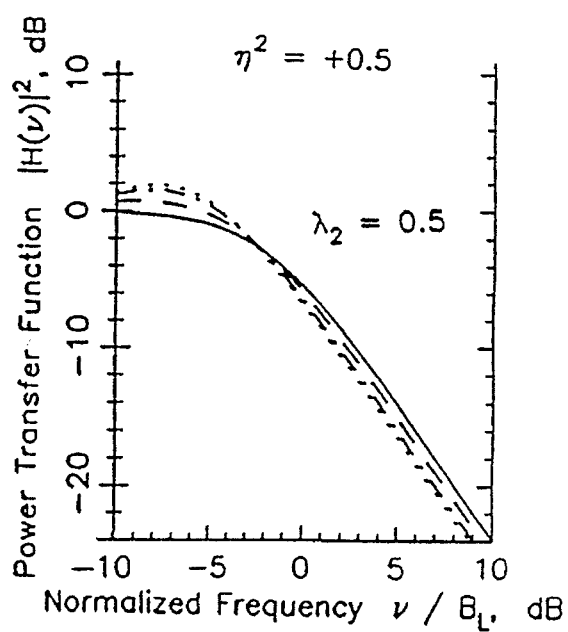

When the root expressions in Equation (3.16) and the κ expressions in Equation (3.11) are substituted into these equations for the κ's, one can solve for $\beta_1$ and α's in terms of $B_L$, $\lambda_i$, and $\eta_i^2$. Results for the α's are given for loops of order 1 to 4 in the second line of equations for each loop order in Table 3-2. To tie in with traditional parameters, the α's are also given in terms of r, η, and a in the third line in Table 3-2. A graphical mapping between the new parameters and traditional parameters is presented in FIGS. 2, 3, and 4 for second-, third- and fourth-order loops, respectively. For reference, plots of the transfer functions for loops of order 1 to 4 are presented in FIG. 5 for various values of $\lambda_i$ and $\eta_i^2$.

Since the transient response of a loop is characterized by the solution, Equation (3.12), to the homogeneous equation, knowledge of root locations provides a basis for predicting transient behavior and settling time. Because the $\eta_i^2$ and $\lambda_i$ values, along with the loop bandwidth, completely specify the roots by location in the complex plane, loop transient response is directly selected at the outset when the new loop parameters are chosen. For loops of first to fourth orders, Table 3—3 presents loop constants for two likely implementations: a) standard underdamping, where all roots have the same decay time (all $\lambda_i=1$) and all $\eta_i^2=-1$ and b) supercritical damping, where all roots have the same decay time and are critically damped (all $\eta_i^2=0$). For comparison, Table 3—3 also presents the corresponding conventional parameters.

3.2.4 DETAILED DERIVATION FOR A FOURTH-ORDER DPLL

To illustrate the method hereof, a fourth-order loop will be treated in detail. As indicated by Equation (3.16), the roots for a fourth-order loop are expressed in terms of the controlled-root parameters as $$\{s_1, s_2; s_3, s_4\} = \{-\beta_1(1\pm\eta_1); -\beta_1\lambda_2(1\pm\eta_2)\} \quad (3.23)$$

Using Equations (3.19) through (3.22) and Equation (3.23), we can write:

$$\kappa_1 = -(s_1 + s_2 + s_3 + s_4) \quad (3.24)$$
$$= (2 + 2\lambda_2)\beta_1$$

$$\kappa_2 = s_1s_2 + s_1s_3 + s_1s_4 + s_2s_3 + s_2s_4 + s_3s_4 \quad (3.25)$$
$$= (4\lambda_2 + (1 - \eta_1^2) + \lambda_2^2(1 - \eta_2^2))\beta_1^2$$

$$\kappa_3 = -(s_1s_2s_3 + s_1s_2s_4 + s_1s_3s_4 + s_2s_3s_4) \quad (3.26)$$
$$= (2\lambda_2(1 - \eta_1^2) + 2\lambda_2^2(1 - \eta_2^2))\beta_1^3$$

$$\kappa_4 = s_1s_2s_3s_4 \quad (3.27)$$
$$= \lambda_2^2(1 - \eta_1^2)(1 - \eta_2^2)\beta_1^4$$

Equation (3.24) can be used to express $\beta_1$ in terms of $\kappa_1$:

$$\beta_1 = \frac{\kappa_1}{2 + 2\lambda_2} \quad (3.28)$$

This expression and Equation (3.11) can be substituted in Equations (3.25) to (3.27) and the three resulting equations can be solved for the $\alpha$'s to give $$\alpha_2 = \frac{4\lambda_2 + (1 - \eta_1^2) + \lambda_2^2(1 - \eta_2^2)}{(2 + 2\lambda_2)^2} \quad (3.29)$$

$$\alpha_3 = \frac{2\lambda_2(1 - \eta_1^2) + 2\lambda_2^2(1 - \eta_2^2)}{(2 + 2\lambda_2)^3} \quad (3.30)$$

$$\alpha_4 = \frac{\lambda_2^2(1 - \eta_1^2)(1 - \eta_2^2)}{(2 + 2\lambda_2)^4} \quad (3.31)$$

Analytical evaluation of the loop bandwidth integral in Equation (3.10) gives loop bandwidth in terms of the $\kappa$'s:

$$B_L = \frac{\kappa_1^2\kappa_2\kappa_3 - \kappa_1\kappa_3^2 - \kappa_1^3\kappa_4 + \kappa_2^2\kappa_3 - \kappa_1\kappa_2\kappa_4 - \kappa_3\kappa_4}{4(\kappa_1\kappa_2\kappa_3 - \kappa_3^2 - \kappa_1^2\kappa_4)} \quad (3.32)$$

Substitution of Equation (3.11) into this expression allows a solution for $\kappa_1$ in terms of $B_L$ and the $\alpha$'s:

$$\kappa_1 = 4B_L = \frac{\alpha_2\alpha_3 - \alpha_3^2 - \alpha_4}{\alpha_2\alpha_3 - \alpha_3^2 - \alpha_4 + \alpha_2^2\alpha_3 - \alpha_2\alpha_4 - \alpha_3\alpha_4} \quad (3.33)$$

Note that this equation in combination with Equation (3.28) shows that $\beta_1$ is proportional to $B_L$.

Thus, if $\eta_1^2$, $\lambda_2$, and $\eta_2^2$ are specified, one can calculate the $\alpha$'s using Equations (3.29) to (3.31). These values of $\alpha_i$ can then be substituted in Equation (3.33) along with $B_L$ to obtain a value for $\kappa_1$. This value for $\kappa_1$, along with the $\alpha$'s, lead to values for $\kappa_2$, $\kappa_3$, and $\kappa_4$ through Equation (3.11). As shown in Equation (3.3) and listed in Table 3-2, the $\kappa$'s are multiplied by an appropriate power of T to obtain the $\kappa$'s to be used in the loop filter. In this manner, the loop constants for a fourth-order loop (in the limit T→0) can be calculated in terms of loop bandwidth and the controlled-root parameters $\eta_i^2$ and $\lambda_i$.

3.3 LOOPS WITH DISCRETE UPDATE INTERVALS

3.3.1 LOOP EQUATION

A loop with phase and phase-rate feedback and immediate updates will be analyzed in the text while Appendix B summarizes differences found in the analysis of loops with a computation delay of one update interval. Equation (2.1) can be used to rewrite Equation (3.1) in terms of the model phase and signal phase:

$$\Delta\phi_{m,n+1} + K_1\phi_{m,n} + K_2 \sum_{i=1}^{n} \phi_{m,i} + K_3 \sum_{i=1}^{n}\sum_{j=1}^{i} \phi_{m,j} + \ldots = \quad (3.34)$$
$$K_1\phi_n + K_2 \sum_{i=1}^{n} \phi_i + K_3 \sum_{i=1}^{n}\sum_{j=1}^{i} \phi_j + \ldots$$

where the operator $\Delta$ is defined by $$\Delta\chi_n = \chi_n - \chi_{n-1} \quad (3.35)$$

and where Equation (2.2) has been used to replace estimated phase rate $\dot{\phi}_{m,n+1}$ T with $\Delta\phi_{m,n+1}$, under the assumption that the NCO is updated with both phase and phase rate. To convert Equation (3.34) to a difference equation, apply the $\Delta$ operator (N−1) times:

$$\Delta^N\phi_{m,n+1} + K_1\Delta^{N-1}\phi_{m,n} + K_2\Delta^{N-2}\phi_{m,n} + \ldots + K_N\phi_{m,n} = K_1\Delta^{N-1}\phi_n + K_2\Delta^{N-2}\phi_n + \ldots + K_N\phi_n \quad (3.36)$$

where N is the loop order. In analogy with Equation (3.6), solution of this difference equation will give the behavior of model phase $\phi_m$ in response to signal phase $\phi$.

3.3.2 TRANSFER FUNCTION

To find the frequency response of the loop, take the z-transform of both sides of Equation (3.36) to obtain $$z(1-z^{-1})^N\phi_m(z) + (1-z^{-1})^{N-1}K_1\phi_m(z) + \ldots + K_N\phi_m(z) = (1-z^{-1})^{N-1}K_1\phi(z) + \ldots + K_N\phi(z) \quad (3.37)$$

where $\phi_m$ and $\phi$ are the z-transforms of $\phi_{m,n}$ and $\phi_n$, respectively. To reach this expression, we have used the relations $$Z\{\Delta^N\chi_n\} = (1-z^{-1})^N Z\{\chi_n\} \quad (3.38)$$

and $$Z\{\chi_{n+1}\} = z\, Z\{\chi_n\} \quad (3.39)$$

where $Z\{\}$ represents a z-transform. Since the closed-loop transfer function is defined by $$\phi_m(z) = \bar{H}(z)\phi(z) \quad (3.40)$$

we find that Equation (3.37) yields the expression $$\bar{H}(z) = \frac{D(z) - (z-1)^N}{D(z)} \quad (3.41)$$

where $$D(z) = (z-1)^N + (z-1)^{N-1}K_1 + z(z-1)^{N-2}K_2 + z^2(z-1)^{N-3}K_3 + \ldots + z^{N-1}K_N \quad (3.42)$$

The frequency response of the loop is obtained by substituting $$z = e^{i2\pi\nu T} \quad (3.43)$$

in Equation (3.41) where $\nu$ is the frequency in $H_z$. Plots of the transfer function for various loop implementations are presented in FIGS. 7–10.

3.3.3 LOOP-NOISE BANDWIDTH

In analogy with Equation (3.10), the single-sided noise bandwidth for the closed loop is defined by $$2B_L \equiv \int_{-\frac{1}{T}}^{\frac{1}{T}} |\tilde{H}(e^{i2\pi\nu T})|^2 d\nu \quad (3.44)$$

which can be rewritten as a contour integral in the form $$2B_L T = \frac{1}{2\pi i} \oint \tilde{H}(z)\tilde{H}(z^{-1})z^{-1}dz \quad (3.45)$$

where the closed path is along the unit circle. This integral can be computed on the basis of residues within the unit circle to obtain $B_L T$ as a function of the poles of the integrand. For simple poles, the integral is given by $$2B_L T = \sum_i \{(z-z_i)\tilde{H}(z)\tilde{H}(z^{-1})z^{-1}\}_{z \to z_i} \quad (3.46)$$

where the $z_i$ are poles of the integrand within the unit circle. (For cases with poles of order greater than first, the residue evaluation must be appropriately modified.)

As seen in Equation (3.41), the poles of $\tilde{H}(z)$ are the roots of the polynominal $D(z)$ in the denominator of $H(z)$ and therefore satisfy the characteristic equation $$D(z)=(z-1)^N+(z-1)^{N-1}K_1+z(z-1)^{N-2}K_2+z^2(z-1)^{N-3}K_3+\ldots+z^{N-1}K_N=0 \quad (3.47)$$

Let the N roots of this polynominal be $z_i$ so that this equation can also be written as $$D(z)=(z-z_1)(z-z_2)(z-z_3)\ldots(z-z_N)=0 \quad (3.48)$$

Since the N roots of $D(z)$ must all lie within the unit circle if the loop is to be stable (see next subsection), all poles of $\tilde{H}(z^{-1})$ will lie outside the unit circle and will not contribute to the contour integral. Furthermore, one can easily show that the residue for the pole at $z=0$ is zero since $H(z^{-1}) \to 0$ as $z \to 0$. Thus the contour integral can be evaluated in a straightforward though algebraically tedious fashion on the basis of the N poles of $\tilde{H}(z)$. The resulting expressions for $B_L T$ as a function of the roots $z_i$ are lengthy and uninformative, particularly for the higher-order loops, and will not be presented here.

3.3.4 LOOP CONSTANTS FROM LOOP ROOTS

To obtain the relationship between the roots and the loop constants, first collect terms according to the power of z in Equations (3.47) and (3.48). When the coefficients of like powers of z are equated, one obtains N equations relating roots and loop constants:

$$\sum_i z_i = \binom{N}{1} - K_1 - K_2 - \ldots - K_N \quad (3.49)$$

$$\sum_{i<j} z_i z_j = \binom{N}{2} - \binom{N-1}{1}K_1 - \binom{N-2}{1}K_2 - \ldots - K_{N-1} \quad (3.50)$$

$$\sum_{i<j<k} z_i z_j z_k = \binom{N}{3} - \binom{N-1}{2}K_1 - \binom{N-2}{2}K_2 - \ldots - K_{N-2}$$

$$\vdots$$

$$\sum_i \frac{z_1 z_2 \ldots z_N}{z_i} = \binom{N}{N-1} - \binom{N-1}{N-2}K_1 - K_2 \quad (3.52)$$

$$\prod_i z_i = 1 - K_1 \quad (3.53)$$

where $(N/\kappa)$ is the binomial coefficient. These N equations can be used to solve for each of the N loop constants in terms of the N roots, $z_i$. First solve Equation (3.53) for $K_1$. The result can then be substituted in Equation (3.52) to allow a solution for $K_2$ in terms of the $z_i$. Proceeding sequentially in this manner through the rest of the equation, one can obtain an expression for each loop constant in term of the roots. Thus, if the roots are known, the loop constants can be calculated.

When the contour integral for $B_L T$ is evaluated as a function of roots for a given loop order, the result can be reduced to a form that contains only the functions of $z_i$ found on the left-hand side of Equations (3.49) to (3.53). When this form is reached, $B_L T$ can then be easily expressed as a function of only the loop constants. The results are presented in Table 3–4 for loops of order one to four.

3.3.5 SOLUTION TO HOMOGENEOUS EQUATION

Solutions to the homogeneous form of Equation (3.36) provide information as to the transient behavior and stability of the loop. The general non-degenerate solution to the homogeneous equation is given by $$\phi_{m,n} = \sum_i^N a_i z_i^n \quad (3.54)$$

where the N amplitudes $a_i$ are to be determined from initial conditions and where the N complex numbers $z_i$ are again the roots of the polynominal $D(z)$ in Equation (3.47). (To see that these roots provide solutions to the homogeneous equation, substitute $\phi_{m,n}=z^n$ in the left-hand side of Equation (3.36), with the right-side set equal to zero, and reduce to the form of Equation (3.47).) Thus, the roots from the homogeneous equation are also the poles of the transfer function. In order for the loop to be stable, the loop constants $K_i$ must be set to values that cause all the roots to fall within the unit circle. With a modulus less than 1, a root cannot cause the homogeneous solution in Equation (3.54) to diverge.

3.3.6 LOOP PARAMETERIZATION

Loop parameterization in the case of discrete update intervals parallels Section 3.2.3 for the CU limit. Loop noise bandwidth $B_L$ and the same root-location parameters are adopted as independent loop parameters. The roots will be parameterized in the form $$\{z_1, z_2; z_3, z_4; \ldots\} = \{e^{-\beta_1(1\pm\eta_1)T}; e^{-\lambda_2\beta_1(1\pm\beta_2)T}; \ldots\} \quad (3.55)$$

where $\lambda_i$ and $\eta_i$ are the N–1 independent parameters specified in Section 3.2.3, with $\lambda_1 \equiv 1$. These parameters and "normalized" loop bandwidth $B_L T$ will comprise the N independent loop parameters needed to completely specify the loop.

In Equation (3.55), the reference decay-rate parameter $\beta_1$, which will be represented in the normalized, dimensionless form $\beta_1 T$ in the DU case, must be determined as a function of these N parameters. In the CU limit, determination of $\beta_1$ in terms of $B_L$, $\lambda_i$ and $\eta_i$, could be carried out explicitly, as shown in Section 3.2.3. For DU loops, however, the complexity of the equations makes a closed-form solution in the general case impractical. Thus, a numerical solution has been carried out by first selecting a value for $\beta_1 T$ and the N−1 independent parameters, $\lambda_i$ and $\eta_i$, and then computing numerical values for the N roots $z_i$ through use of Equation (3.55). The resulting $z_i$ values can be used to compute the normalized loop bandwidth, $B_L T$, as shown in Section 3.3.3, and the loop constants, as shown in Section 3.3.4. Repeating the process in this fashion on the basis of the same $\lambda_i$ and $\eta_i$ values, one can vary the parameter $\beta_1 T$ numerically to obtain $B_L T$ and the loop constants as a function of $\beta_1 T$.

Figure 6A:
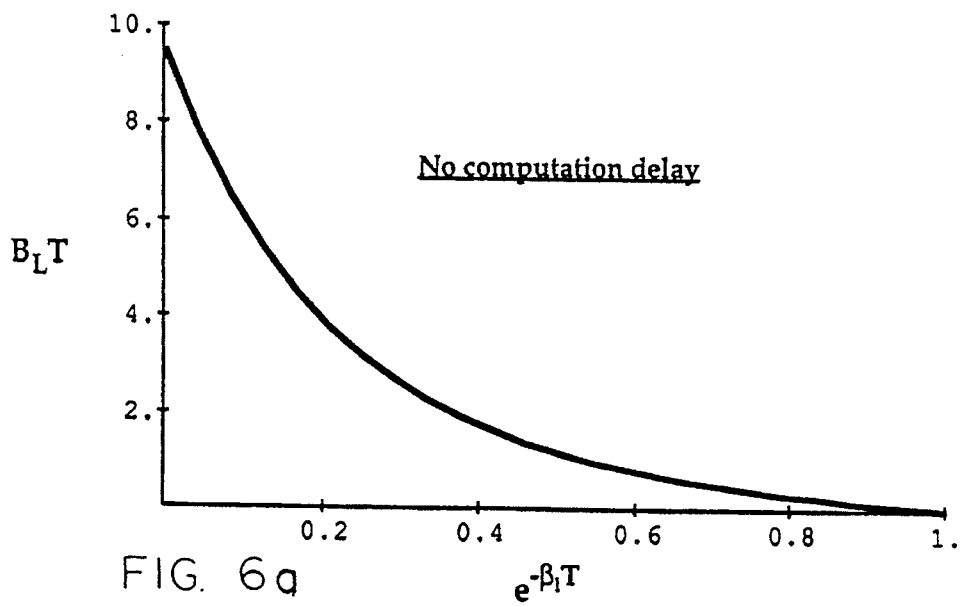
FIGS. 6a and 6b, is a graphical illustration of normalized loop bandwidth $B_LT$ versus reference decay rate parameter $B_LT$ for a third-order loop without, and with computation delay, respectively.
Figure 6B:
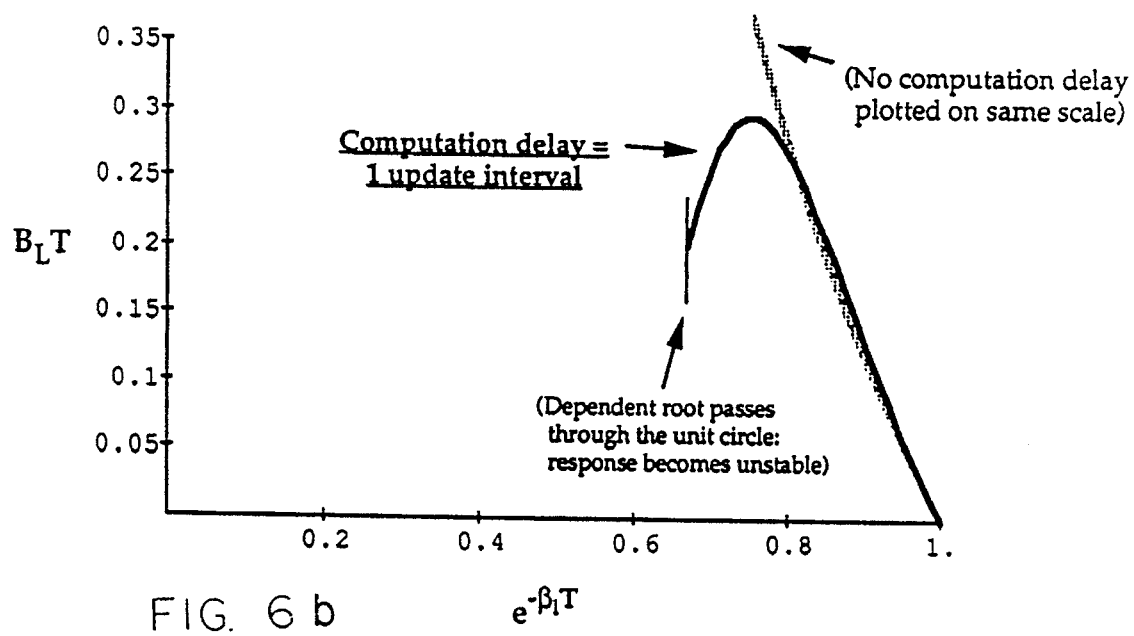
Figure 7A:
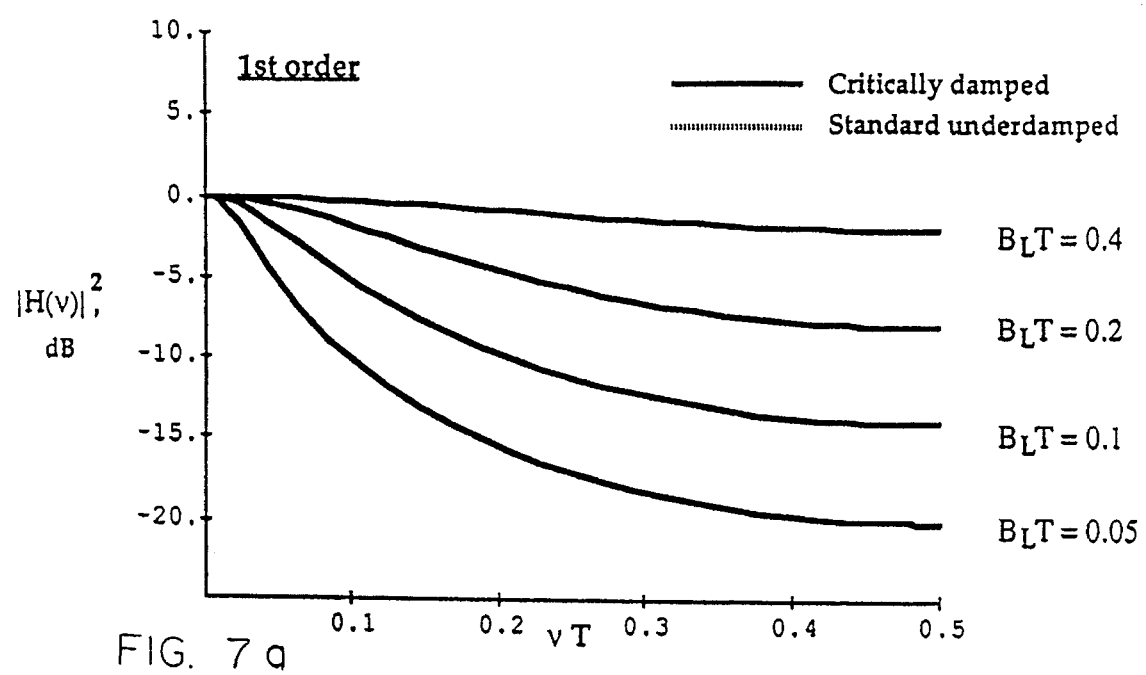
FIGS. 7a and 7b, is a graphical illustration of transfer functions for first and second order loops with phase and phase-rate feedback and no computation delay.
Figure 7B:
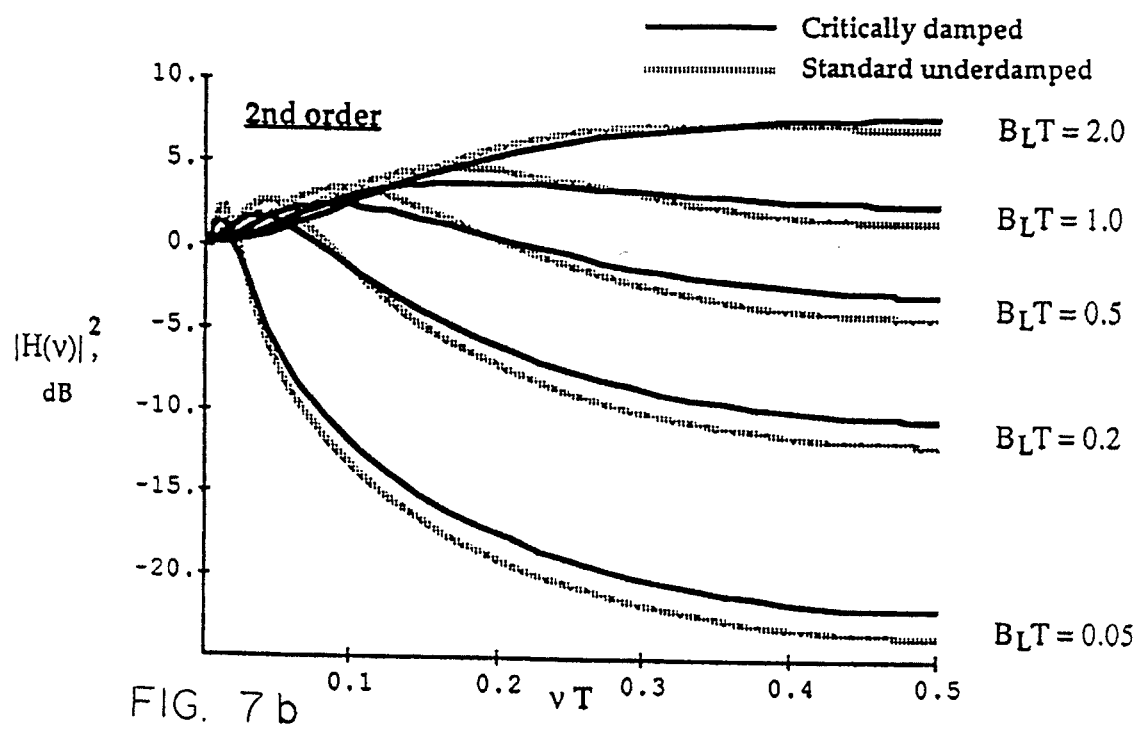
Figure 8A:
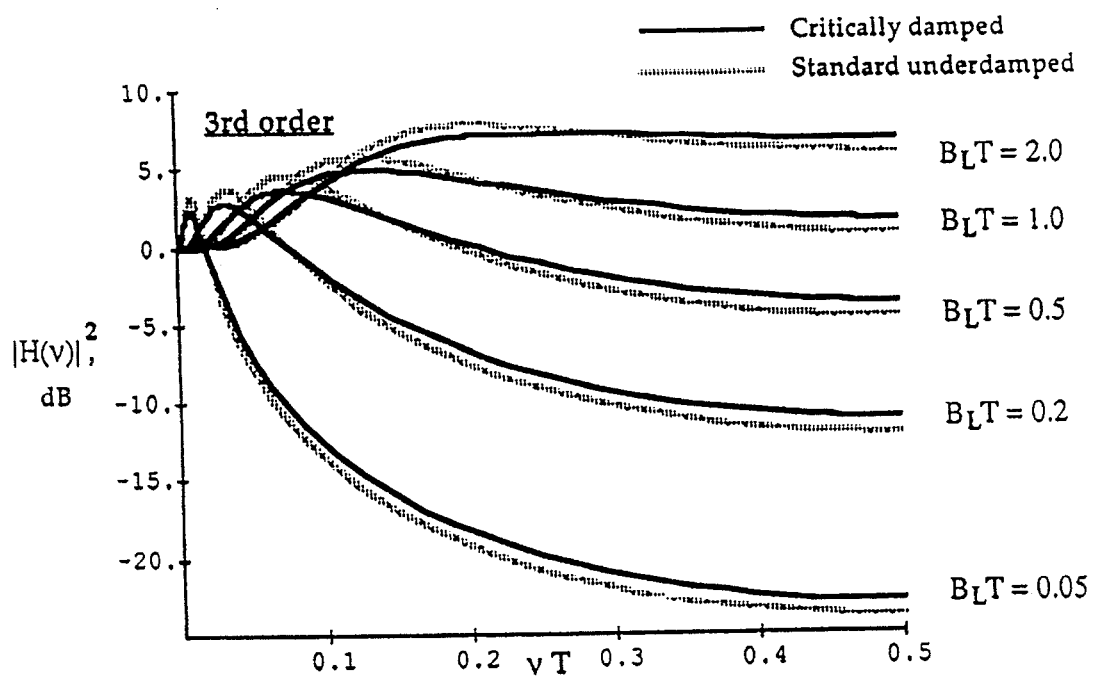
FIGS. 8a and 8b, is a graphical illustration of transfer functions for third and fourth order loops with phase and phase-rate feedback and no computation delay.
Figure 8B:
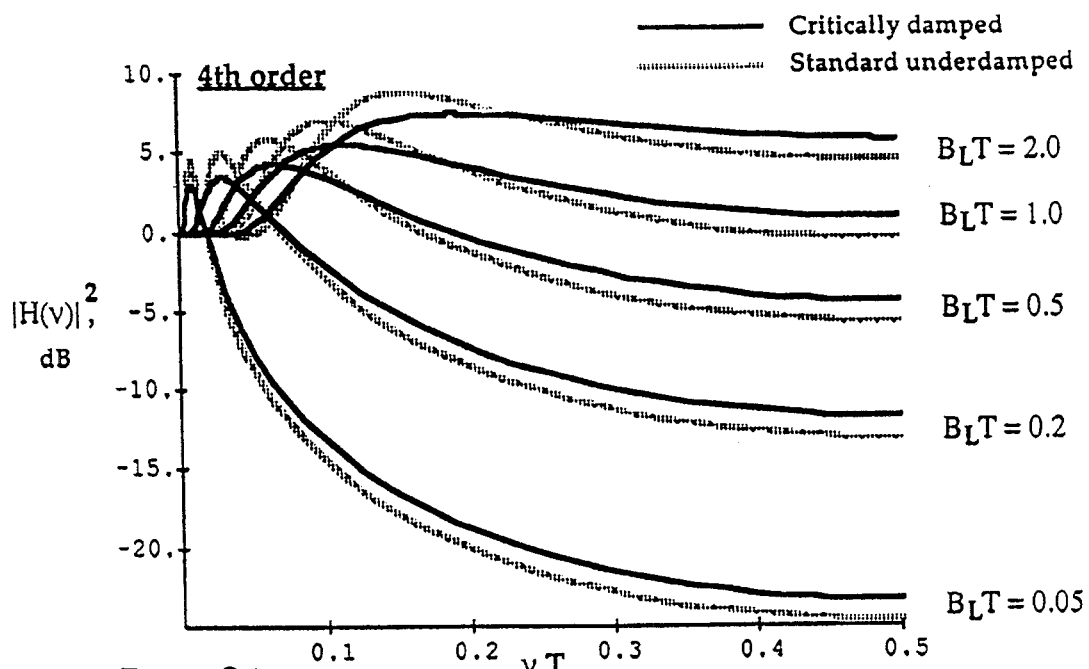
Figure 9A:
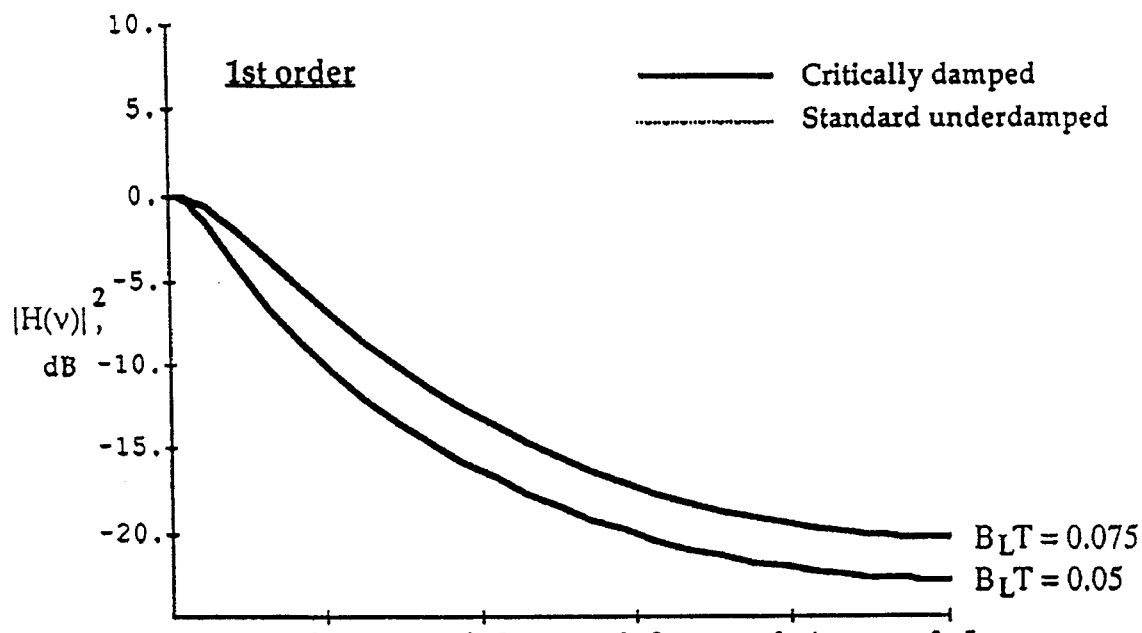
FIGS. 9a and 9b, is a graphical illustration of transfer functions for first and second order loops with phase and phase-rate feedback and computation delay of one update interval.
Figure 9B:
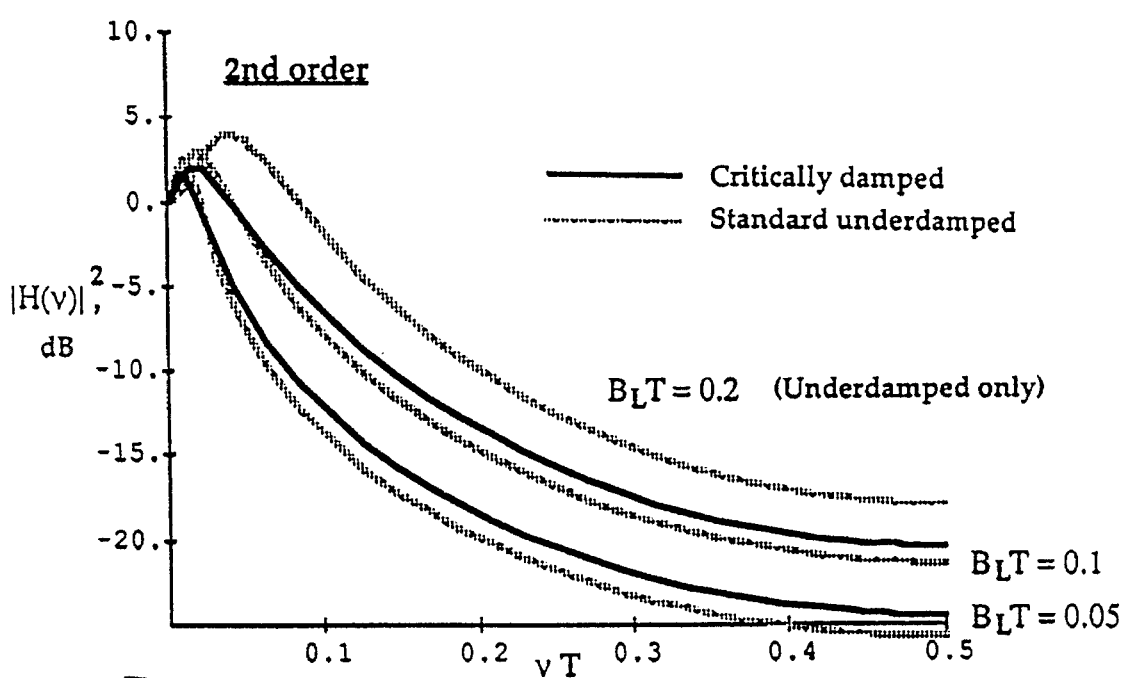
Figure 10A:
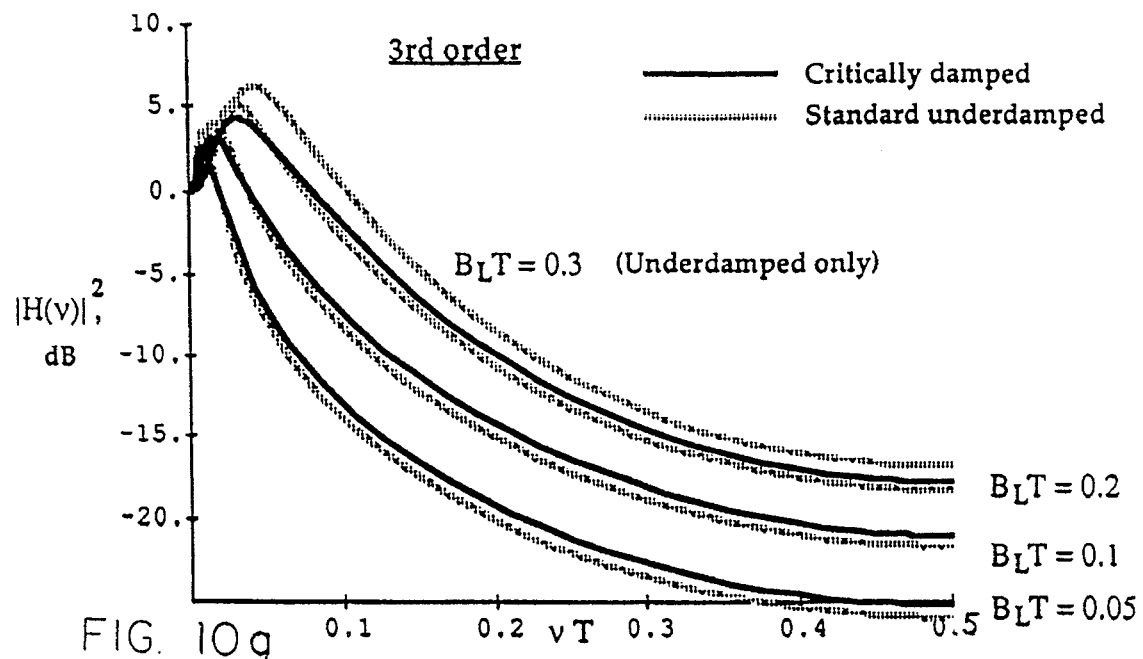
FIGS. 10a and 10b, is a graphical illustration of transfer functions for third and fourth order loops with phase and phase-rate feedback and computation delay of one update interval.
Figure 10B:
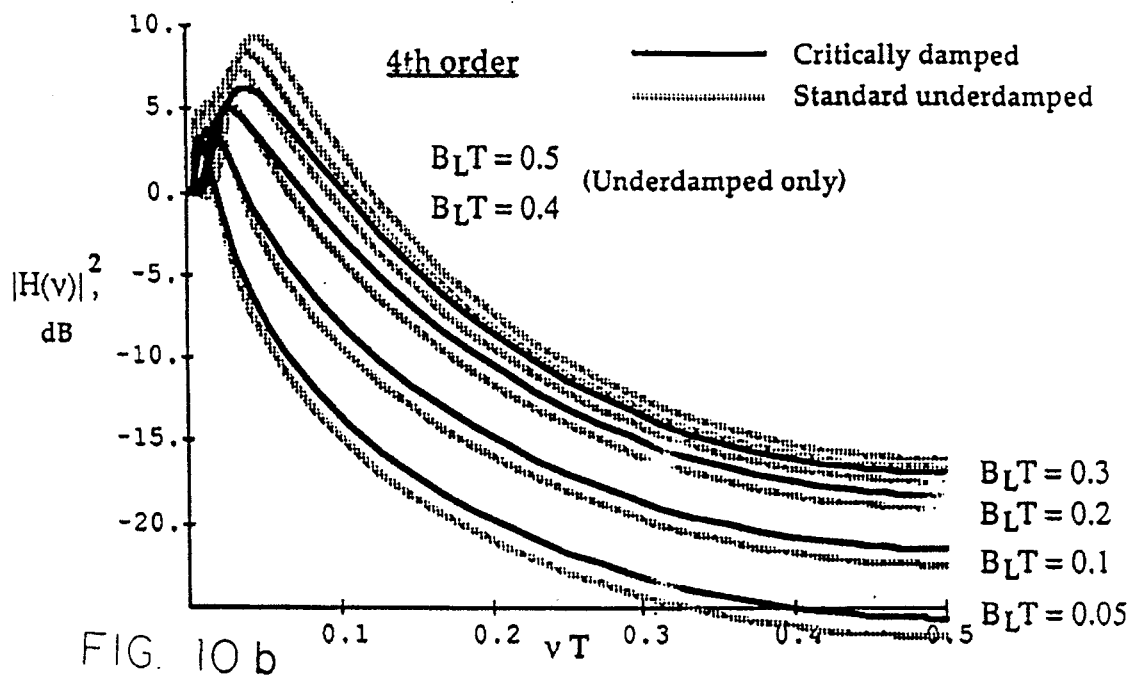

In general, $B_L T$ increases as $\beta_1 T$ increases from zero but can go no higher than a loop-specific maximum value. Plots of $B_L T$ versus $\beta_1 T$ are shown in FIGS. 6a and 6b for two supercritically-damped third-order loops with phase and phase-rate update, one with a computation delay of zero, the other with a computation delay equal to one update interval. In the zero-computation delay case, $B_L T$ can get no higher than 9.5, which corresponds to a $\beta_1 T$ value of +∞. In the other case, $B_L T$ reaches a peak at $\beta_1 T = -\ln(\frac{3}{4})$ as $\beta_1 T$ increases, where $B_L T \approx 0.3$ is the maximum attainable value.

For a given $B_L T$, therefore, one can find the corresponding $\beta_1 T$, if any, and the corresponding loop constants on the basis of the analysis outlined above. Thus, loop constants can be determined for given $\lambda_i$ and $\eta_i$ as a function of $B_L T$. Results are presented in Tables 3–5 and 3–6 for loops of order one to four, given phase and phase-rate feedback, supercritical damping and standard underdamping. Once $\beta_1$ and the loop roots are known, the transfer function can be computed on the basis of Equation (3.41). Results are plotted in FIGS. 7a and 7b through FIGS. 10a and 10b for the two standard loop configurations.

Even though a general solution to the DU loop has not been obtained, the equations can be expanded as a power series in $B_L T$ to obtain the higher-order terms relative to the CU limit. Results are presented in Table 3–7 and 3–8 for the loop constants as a power series in $B_L T$ for the standard loops.

3.4 EXAMPLE OF STRAYING ROOTS AT LARGE $B_L T$ VALUES IN THE CONTINUOUS-UPDATE APPROXIMATION

Figure 11A:
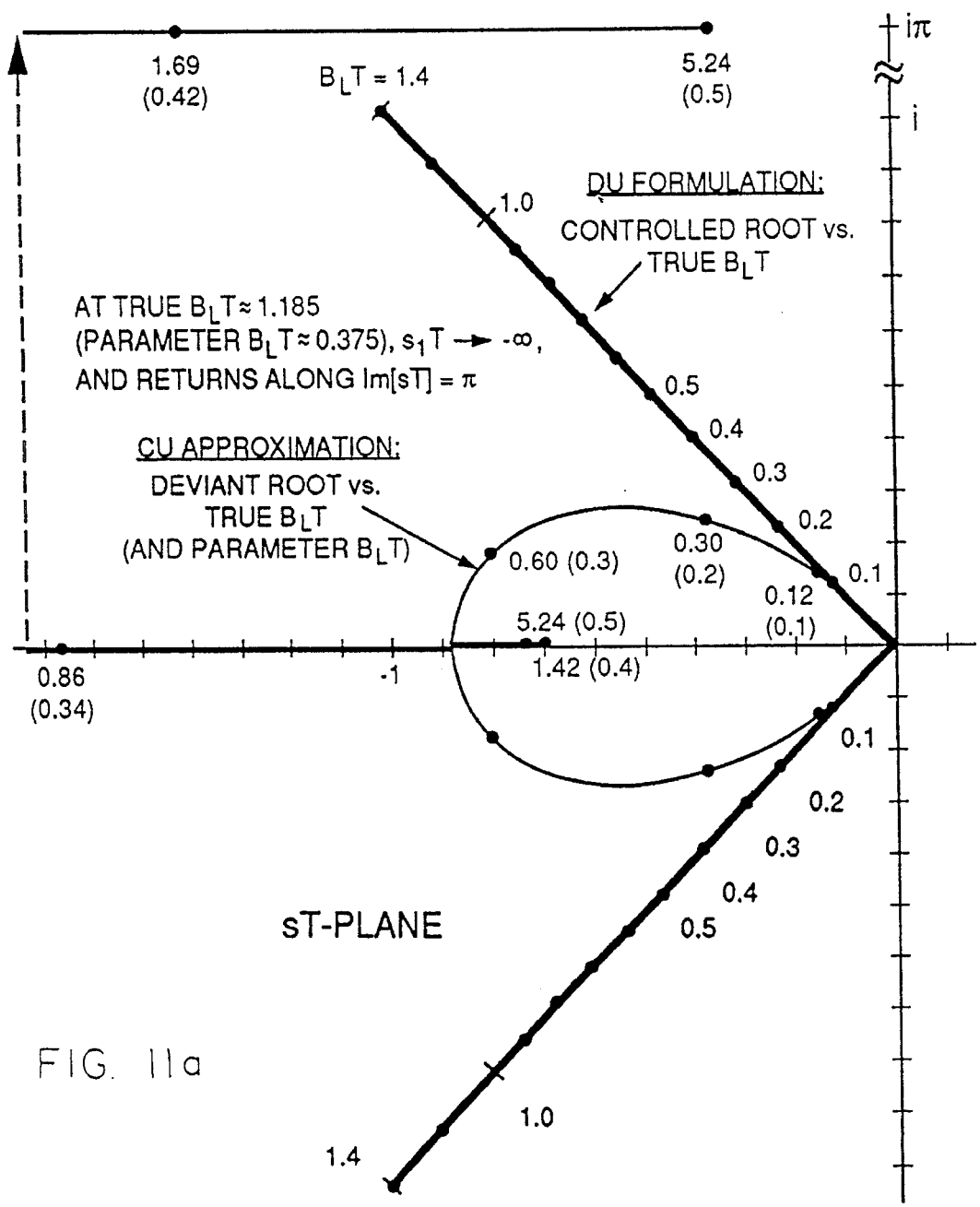
FIGS. 11a and 11b, is a graphical illustration of root-locus plots for a second order loop using discrete-update formulation (thick line) and continuous-update approximation (thin line) as a function of $B_LT$.
Figure 11C:
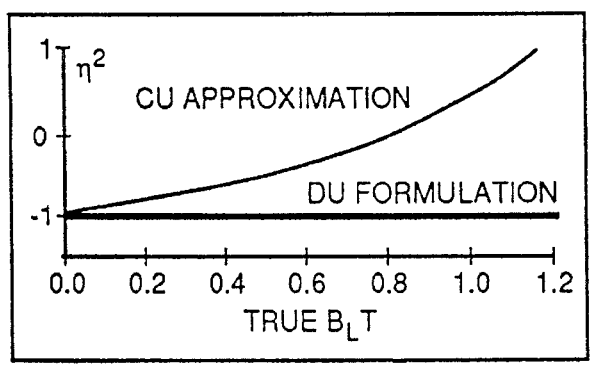
FIG. 11, comprising
Figure 11B:
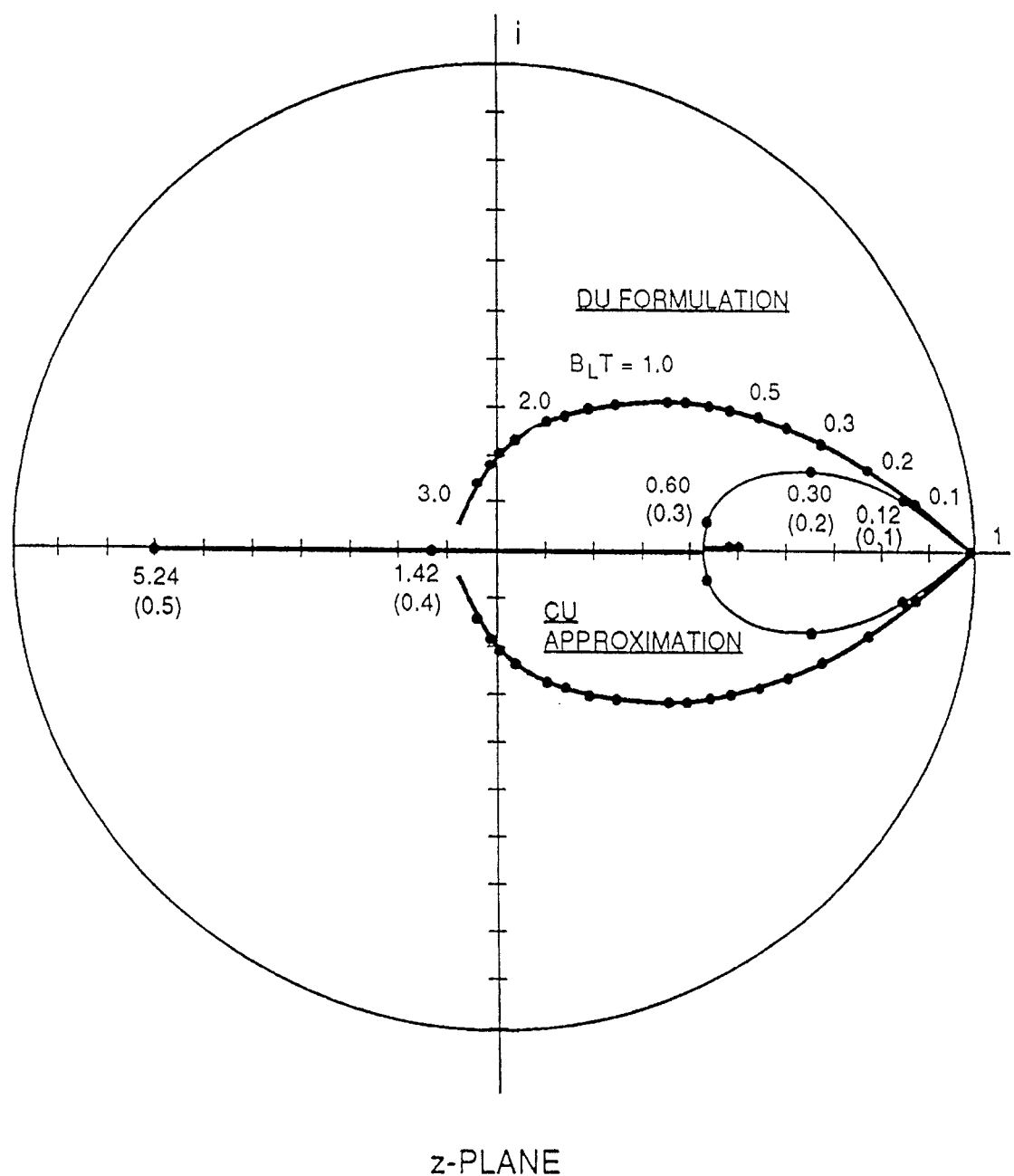

As $B_L T$ increases in the CU approximation for loop constants (e.g., Table 3–3), the path of the loop roots can stray from their original intended course and true loop noise bandwidth can exceed the $B_L$ parameter value used to compute the loop constants. This deviation is illustrated in both the sT-plane and z-plane in FIGS. 11a and 11b for a second-order DU loop with phase and phase-rate feedback, standard underdamping, and no computation delay. The thick straight lines, which are based on the exact DU solution presented in preceding subsections, show the paths taken by standard-underdamped roots as (true) $B_L T$ increases from 0 to 1.4. The thin curved lines, which are produced by the CU approximation, follow the DU lines until about $B_L T = 0.1$ and then curve toward the real axis. (Note that the CU-approximation curves are marked by both true $B_L T$ values and "parameter" $B_L T$ values. True $B_L T$ is the actual effective noise bandwidth for a DU loop, while "parameter" $B_L T$ is the value used to compute the loop constants in Table 3—3.) Where the curves separate, the CU approximation starts to diverge from standard underdamping and loop transient response changes. The inset plot illustrates this divergence in terms of the corresponding damping parameter $\eta^2$, which starts at the intended underdamped value of −1 at $B_L T = 0$, increases to a critically-damped value of 0 at true $B_L T = 0.8$, and then approaches +1 at true $B_L T \approx 1.2$. Thus, loop response at high $B_L T$ values will not match original intended response. In contrast, as indicated by the thick lines, the DU exact solution maintains standard underdamping (i.e., $\eta_i^2 = -1$) for allowed values of $B_L T$.

4.0 TRANSIENT-FREE ACQUISITION WITH DPLLS

If the signal phase and its time derivatives are accurately known at start-up, it is possible to initialize the loop sums and loop phase so that the loop starts tracking in-lock, with no transients. In steady-state tracking, residual phase becomes a constant ($\delta\phi_i = \delta\phi_{ss}$) so that Equation (3.1) or Equation (3.2) becomes $$\Delta\phi_{n+1} = K_1 \delta\phi_{ss} + K_2 \sum_{i=1}^{n-n_c} \delta\phi_i + \quad (4.1)$$

$$K_3 \sum_{i=1}^{n-n_c} \sum_{j=1}^{i} \delta\phi_j + K_4 \sum_{i=1}^{n-n_c} \sum_{j=1}^{i} \sum_{k=1}^{j} \delta\phi_k$$

for up to a fourth-order loop. The quantity $n_c$ is the computation delay, which is zero or one update interval for the present analysis. Note that estimated model phase rate, $\dot\phi_{m,n+1} T$ has been replaced by differenced input phase since model phase tracks input phase exactly, except for a constant offset, in steady-state tracking. Based on this expression, higher-order differences become $$\Delta^2\phi_{n+1} = K_2 \delta\phi_{ss} + K_3 \sum_{i=1}^{n-n_c} \delta\phi_i + K_4 \sum_{i=1}^{n-n_c} \sum_{j=1}^{i} \delta\phi_j \quad (4.2)$$

$$\Delta^3\phi_{n+1} = K_3 \delta\phi_{ss} + K_4 \sum_{i=1}^{n-n_c} \delta\phi_i \quad (4.3)$$

$$\Delta^4\phi_{n+1} = K_4 \delta\phi_{ss} \quad (4.4)$$

One can easily show the differences are related to input phase values by $$\Delta\phi_{n+1} = \phi_{n+1} - \phi_n \quad (4.5)$$

$$\Delta^2\phi_{n+1} = \phi_{n+1} - 2\phi_n + \phi_{n-1} \quad (4.6)$$

$$\Delta^3\phi_{N+1} - 3\phi_n + 3\phi_{n-1} - \phi_{n-2} \quad (4.7)$$

$$\Delta^4\phi_{n+1} - 4\phi_n + 6\phi_{n-1} - 4\phi_{n-2} + \phi_{n-3} \quad (4.8)$$

where each phase value is referenced to interval center. We can relate these phase values to derivatives of incoming signal phase $\phi^{(i)}$ by means of a Taylor expansion whose origin is the center of the $n^{th}$ interval ($t = t_n$):

$$\phi(t) = \phi_n + (t - t_n)\phi_n^{(1)} + \frac{(t-t_n)^2}{2}\phi_n^{(2)} + \quad (4.9)$$

$$\frac{(t-t_n)^3}{6}\phi_n^{(3)} + \frac{(t-t_n)^4}{24}\phi_n^{(4)} + \ldots$$

This expansion shows that phase at the center of the nearby intervals is given by $$\phi_{n+1} = \phi(t_n + T) = \phi_n + T\phi_n^{(1)} + \frac{T^2}{2} \phi_n^{(2)} + \qquad (4.10)$$

$$\frac{T^3}{6} \phi_n^{(3)} + \frac{T^4}{24} \phi_n^{(4)} + \ldots$$

$$\phi_n = \phi(t_n) = \phi_n \qquad (4.11)$$

$$\phi_{n-1} = \phi(t_n - T) = \phi_n - T\phi_n^{(1)} + \frac{T^2}{2} \phi_n^{(2)} - \qquad (4.12)$$

$$\frac{T^3}{6} \phi_n^{(3)} + \frac{T^4}{24} \phi_n^{(4)} - \ldots$$

$$\phi_{n-2} = \phi(t_n - 2T) = \phi_n - 2T\phi_n^{(1)} + 4\frac{T^2}{2} \phi_n^{(2)} - \qquad (4.13)$$

$$8\frac{T^3}{6} \phi_n^{(3)} + 16\frac{T^4}{24} \phi_n^{(4)} - \ldots$$

$$\phi_{n-3} = \phi(t_n - 3T) = \phi_n - 3T\phi_n^{(1)} + 9\frac{T^2}{2} \phi_n^{(2)} - \qquad (4.14)$$

$$27\frac{T^3}{6} \phi_n^{(3)} + 81\frac{T^4}{24} \phi_n^{(4)} - \ldots$$

where T is the separation between intervals ("update interval"). By substituting Equations (4.10) through (4.14) in Equations (4.5) through (4.8), one can easily show the phase differences are related to input phase derivatives by $$\Delta\phi_{N+1} = T\phi_n^{(1)} + \frac{T^2}{2} \phi_n^{(2)} + \frac{T^3}{6} \phi_n^{(3)} + \frac{T^4}{24} \phi_n^{(4)} + \ldots \qquad (4.15)$$

$$\Delta^2\phi_{n+1} = T^2\phi_n^{(2)} + \frac{T^4}{12} \phi_n^{(4)} + \ldots \qquad (4.16)$$

$$\Delta^3\phi_{n+1} = T^3\phi_n^{(3)} - \frac{T^4}{2} \phi_n^{(4)} + \ldots \qquad (4.17)$$

$$\Delta^4\phi_{n+1} = T^4\phi_n^{(4)} + \ldots \qquad (4.18)$$

By respectively equating Equations (4.15) through (4.18) with Equations (4.1) through (4.4), one obtains of unknowns, where the unknowns are $\delta\phi_{ss}$ and the loop a set of equations whose number is equal to the number sums. Thus, these unknowns can be expressed in terms of the derivatives of input phase.

To complete initialization of the loop, an estimate of starting model phase must be computed. To be exact, this estimate must account for steady-state phase error. For an arctangent phase extractor, tracking error is equal to residual phase (neglecting system-noise error and possible cycle ambiguities). For a sine phase extractor, however, steady-state tracking error becomes $$(\phi_n - \phi_{m,n})_{ss} = \arcsin(2\pi\delta\phi_{ss})/2\pi \qquad (4.19)$$

where phase is measured in cycles. Thus, model phase for the $n^{th}$ interval, after accounting for tracking error, is given by $$\phi_{m,n} = \begin{cases} \phi_n - \delta\phi_{ss} & \text{for an arctan extractor} \\ \phi_n - \arcsin(2\pi\delta\phi_{ss})/2\pi & \text{for a sine extractor} \end{cases} \qquad (4.20)$$

where phase is measured in cycles.

The solution for a fourth-order loop will be presented in detail. If we assume that time derivatives of $\phi(t)$ are negligible above $\phi_n^{(4)}$, and equate Equations (4.18) and (4.4), we obtain a value for steady-state residual phase for a fourth-order loop:

$$\delta\phi_{ss} = \frac{T^4}{K_4} \phi_n^{(4)} \qquad (4.21)$$

The loop sums are determined in a similar fashion. By equating Equations (4.3) and (4.17), one can solve for the single sum:

$$\sum_{i=1}^{n-n_c} \delta\phi_i = \frac{1}{K_4} \left( T^3\phi_n^{(3)} - \frac{T^4}{2} \phi_n^{(4)} - K_3\delta\phi_{ss} \right) \qquad (4.22)$$

Similarly, the double sum is determined by equating Equations (4.2) and (4.16):

$$\sum_{i=1}^{n-n_c} \sum_{j=1}^{i} \delta\phi_j = \qquad (4.23)$$

$$\frac{1}{K_4} \left( T^2\phi_n^{(2)} + \frac{T^4}{12} \phi_n^{(4)} - K_2\delta\phi_{ss} - K_3 \sum_{i=1}^{n-n_c} \delta\phi_i \right)$$

where the single sum is known from Equation (4.22). Finally, the triple sum is determined by equating Equations (4.1) and (4.15):

$$\sum_{i=1}^{n-n_c} \sum_{j=1}^{i} \sum_{k=1}^{j} \delta\phi_k = \frac{1}{K_4} \left( T\phi_n^{(1)} + \frac{T^2}{2} \phi_n^{(2)} + \frac{T^3}{6} \phi_n^{(3)} + \qquad (4.24)\right.$$

$$\left.\frac{T^4}{24} \phi_n^{(4)} - K_1\delta\phi_{ss} - K_2 \sum_{i=1}^{n-n_c} \delta\phi_i - K_3 \sum_{i=1}^{n-n_c} \sum_{j=1}^{i} \delta\phi_j \right)$$

where the single and double sums are determined by means of Equations (4.22) and (4.23). Thus, if a priori values of signal phase and its derivatives are available at the start of a track, all of the loop variables can be initialized through use of Equations (4.20) through (4.24). If the a priori information is sufficiently accurate, the loop will start tracking inlock, with no transients.

Based on these equations for loop sums and model phase, the loop can be initialized as follows. Suppose a priori estimates of signal phase and its derivatives for a phantom "$n^{th}$ interval" at time $t_n$ are available. Then Equations (4.22) through (4.24) can provide estimates for loop sums at interval "completion" while Equation (4.20) provides an estimate of model phase at interval center, with steady-state phase error given by Equation (4.21). To project ahead to the first interval to be processed, the $(n+1)^{th}$ first estimate phase rate according to Equation (4.1) using these estimates for loop sums and steady-state phase error. Model phase for the $(n+1)^{th}$ interval is then computed according to Equation (2.2) on the basis of this estimated $(n+1)^{th}$ phase rate and $n^{th}$ a priori signal phase. The resulting values for the $(n+1)^{th}$ phase and rate are then used to initialize the NCO for the $(n+1)^{th}$ interval in the usual fashion. At the completion of the $(n+1)^{th}$ interval, sums are updated in the standard fashion and substituted in Equation (3.1) of Equation (3.2) to provide the $(n+2)^{th}$ estimate of rate. (If $n_c=1$, the estimated steady-state phase error $\delta\phi_{ss}$ is used as residual phase a second time). Equation (2.2) then provides an estimate of the $(n+2)^{th}$ model phase. Loop iteration is normal after this point, and steady-state lock should be achieved.

The above analysis has focused on a fourth-order loop. Similar analysis can be carried out for loops of order lower than fourth, and the results are presented in Table 4-1. The preceding derivation assumed a signal with polynomial phase so that a steady-state phase error would develop. Under less ideal dynamics, the above initialization process will not eliminate transients but can greatly assist direct acquisition with higher-order loops. Similarly, if the derivatives of signal phase are known, but phase is not, the loops sums can be initialized using Equations (4.22) to (4.24), with initial loop phase arbitrarily set to zero. Again, loop acquisition will be greatly enhanced.

5.0 TWO MEASURES OF LOOP PERFORMANCE

5.1 MEAN TIME TO FIRST CYCLE SLIP

Simulations have been carried out to determine mean time to first cycle slip, ($T_{1st}$), for loops with phase and phase-rate feedback, no computation delay, supercritical damping, and a sine phase extractor with perfect amplitude normalization. The tracking-error criterion for detecting a cycle slip was $|\phi-\phi_m|>0.75$ cycles. After each slip, the loop was reinitialized with perfect initial values so that it would start off in steady-state lock with no transients. A Gaussian random-number generator simulated noise for the counter-rotation sums.

Figure 12:
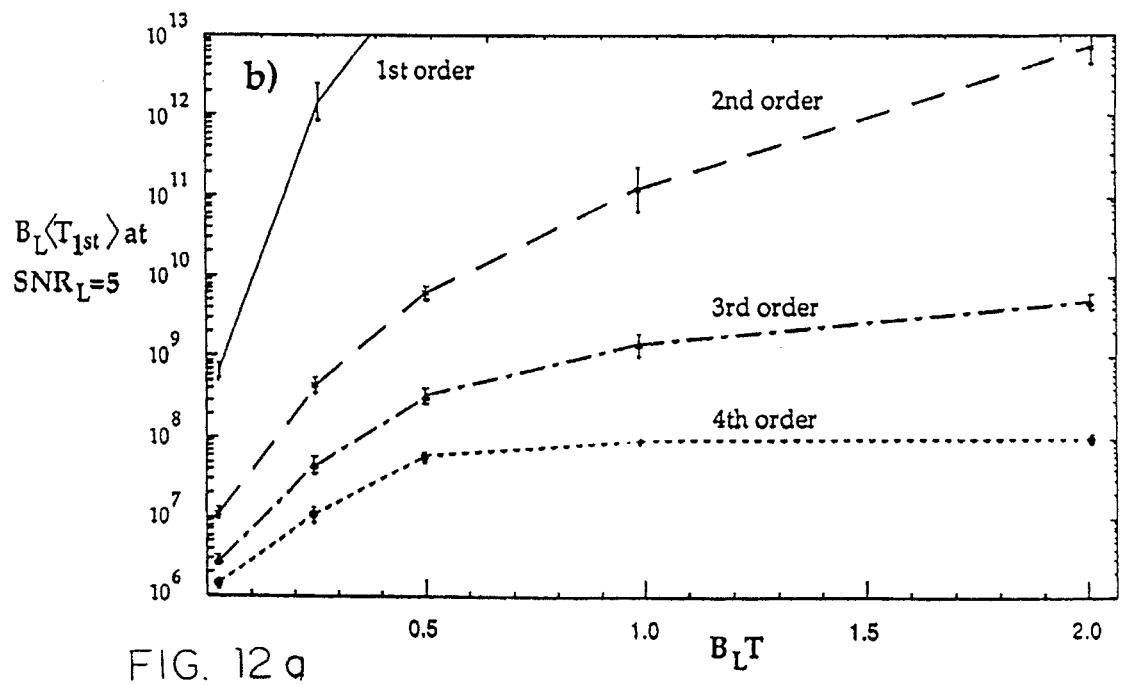
FIG. 12, comprising
Figure 12:
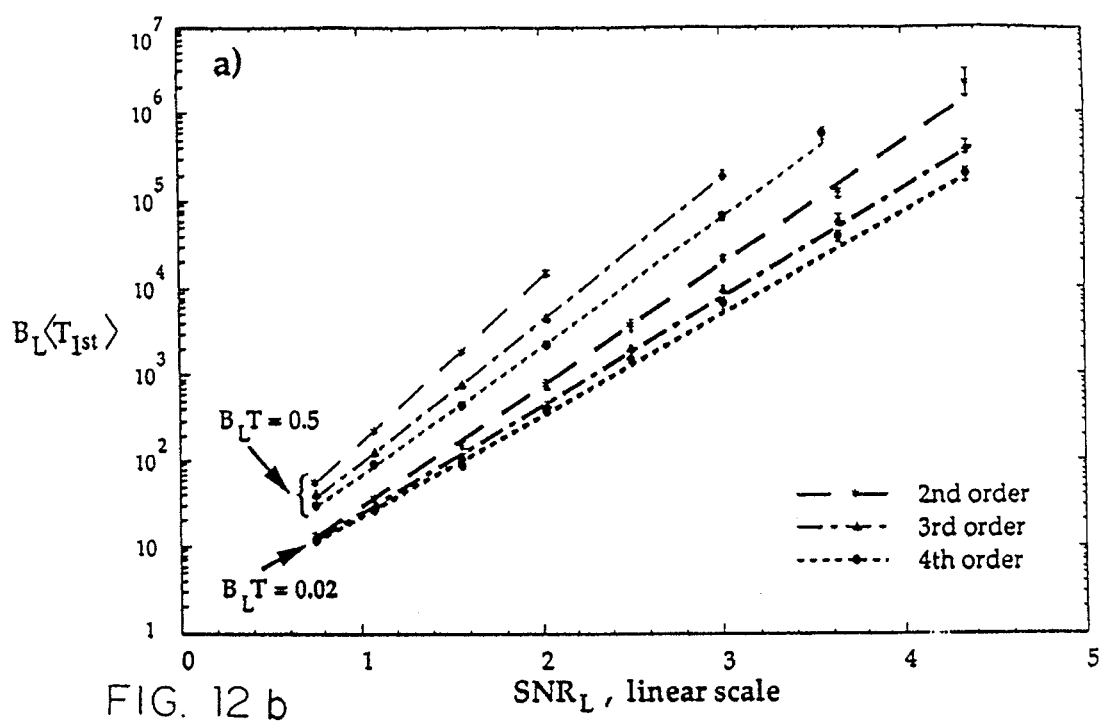

Loops of $2^{nd}$ to $4^{th}$ order have been simulated on the basis of the loop constants in Table 3–5. Assumed values of $B_LT$ ranged between 0.02 and 2.0 and loop SNR between 0 and 6 dB. Results are summarized in FIGS. 12a and 12b, where $B_L$ times mean time to first cycle slip is plotted versus loop SNR. In terms of cycle slips, loop performance deteriorates somewhat as loop order increases, given a fixed loop SNR. For a given loop order and loop SNR, however, cycle-slip performance improves as $B_LT$ increases, as shown in FIGS. 12a and 12b where $B_L(T_{1st})$ is plotted versus $B_LT$ for $2^{nd}$ to $4^{th}$ order loops, given a loop SNR of 7 dB. With a $3^{rd}$ order loop, for example, FIGS. 13a and 13b indicates that $B_L(T_{1st})$ improves by two orders of magnitude when $B_LT$ is increased from 0.02 to 0.5.

As a test of the simulation software, the cycle-slip criteria have been made the same as Viterbi's criteria in his exact closed form solution (5) for a first-order loop in the CU limit. To within a statistical error of about 10%, our results for $B_L(T_{1st})$ agree with Viterbi's theoretical predictions up to $SNR_L=4$ dB, the maximum loop SNR attempted.

0 5.2 STEADY-STATE PHASE ERROR

Loop performance at large values of $B_LT$ has also been assessed in terms of the steady-state phase error (SSPE). In the CU limit, SSPE is proportional to $B_L^{-N}$ for an $N^{th}$ order loop, as can be derived from Tables 4-1 and 3-2. For large values of $B_LT$, however, the SSPE in a root-controlled loop does not decrease as $B_L^{-N}$ as $B_L$ increases, as illustrated in FIGS. 13a, 13b, 14a and 14b. FIGS. 13a, 13b, 14a and 14b plot as a function of $B_LT$ the dimensionless coefficient required to multiply the CU-limit form for SSPE. These plots pertain to loops of order 1 to 4, with phase and phase-rate feedback, with supercritical damping or standard underdamping, and with the indicated computation delay. At $B_LT=0$, the coefficient is equal to the CU-limit value. As $B_LT$ increases, the increase in th is coefficient relative to the zero-$B_LT$ value is a measure of the "excess" SSPE relative to the nominal CU-limit values. As FIGS. 13a and 13b indicate, for example, the SSPE at $B_LT=0.5$ for a third-order, standard underdamped loop, is about four times as large as the CU limit would predict.

Figure 13A:
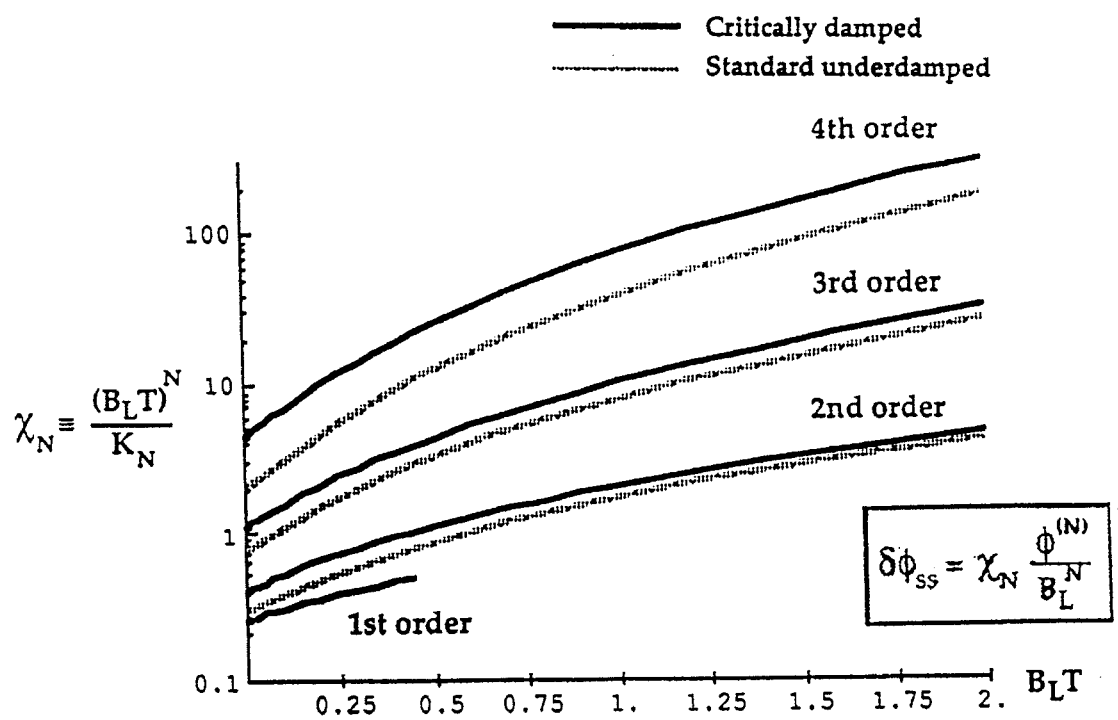
FIGS. 13a and 13b, is a graphical illustration of quantities describing steady-state phase error in discrete-update loops with phase and phase-rate feedback and no computation delay.
Figure 13B:
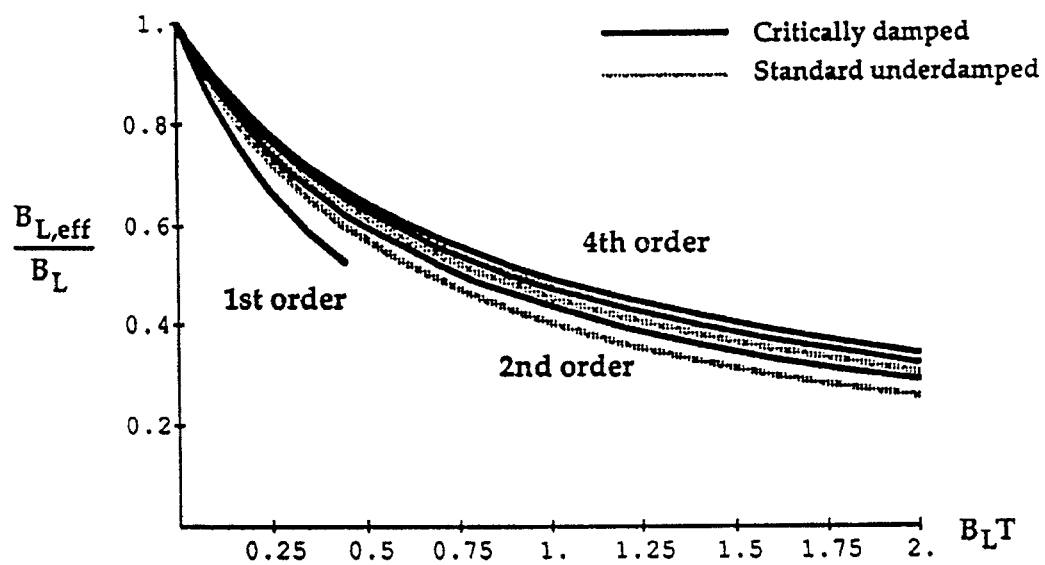
Figure 14A:
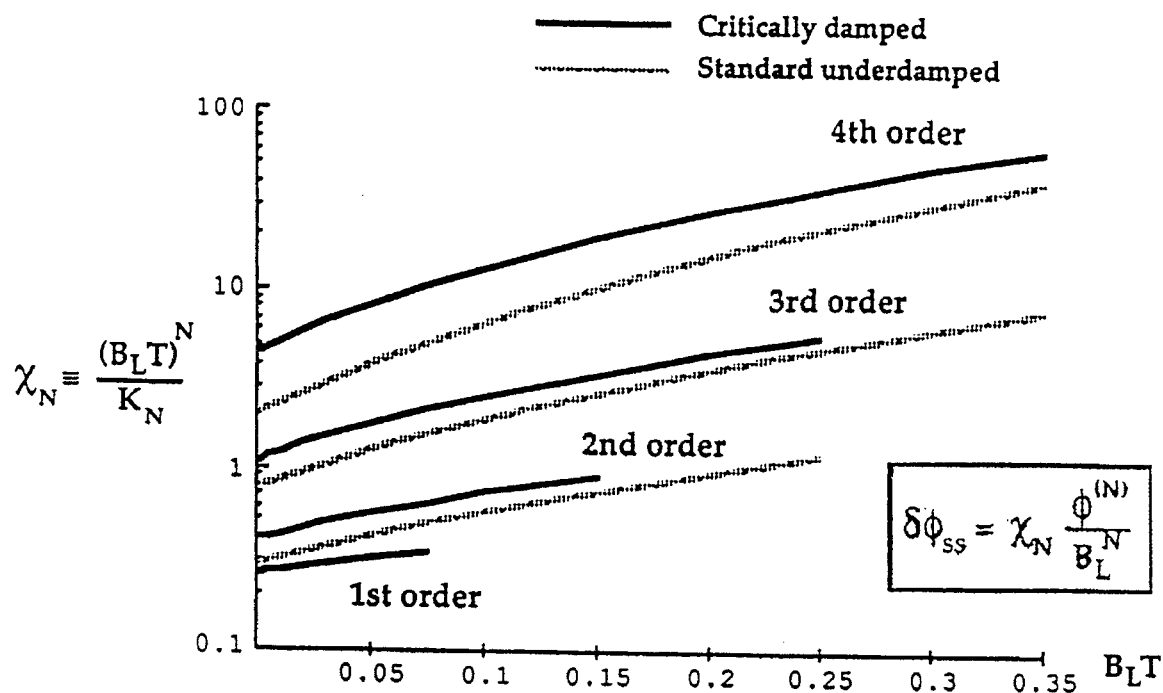
FIGS. 14a and 14b, is a graphical illustration of quantities describing steady-state phase error in discrete-update loops with phase and phase-rate feedback and computation delay of one update interval.
Figure 14B:
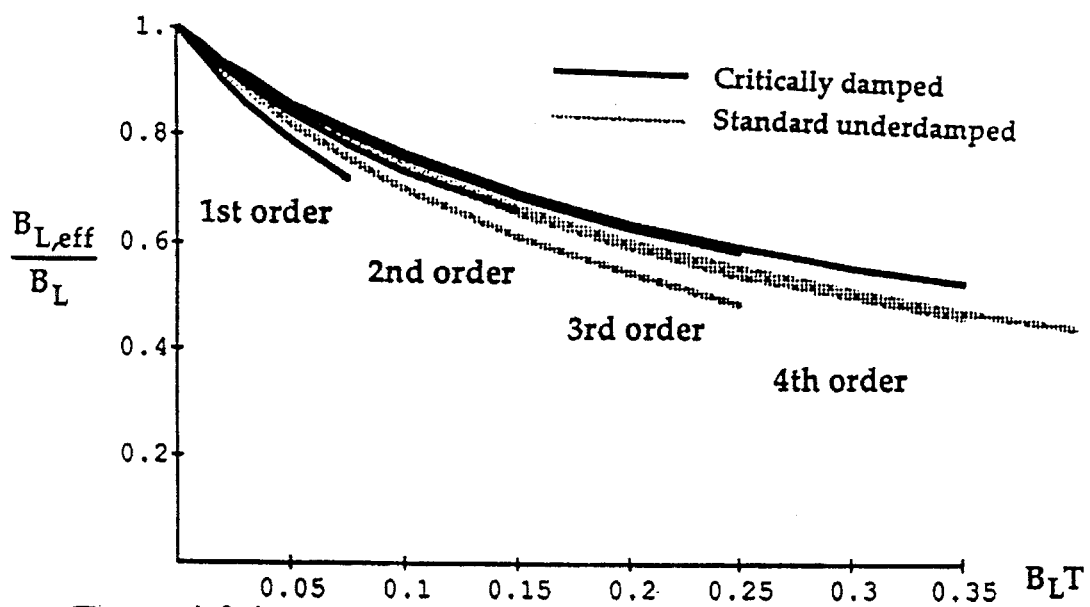

FIGS. 13a, 13b, 14a and 14b plot effective loop bandwidth as determined from SSPE, where "effective" denotes the decrease in bandwidth relative to the $B_L^N$ model. In FIGS. 13a and 13b, for example, the effective bandwidth is about 0.6 times the actual loop bandwidth when $B_LT=0.5$ for a second-order loop.

SUMMARY

A first-principles analysis of DPLLs has led to a new approach for parameterizing loops. Loop constants are computed on the basis of loop noise bandwidth and new con-trolled-root independent parameters that have direct physical significance relative to decay times and damping. In the continuous-update limit, loop constants of loops of first to fourth order are obtained in closed form as a function of these new parameters. In a solution for a discrete-update (DU) loop, however, complexity of the equations leads to a numerical approach. The analysis has been applied to loops with phase and phase-rate feedback, given either zero computation delay or a computation delay equal to one update interval. With the new parameterization, exact selection of loop bandwidth and damping behavior can be carried out for high order loops, even when $B_LT$ is large.

Simulations of loop behavior in terms of mean time to first cycle slip have been carried out for loops of first to fourth order based on the new parameterization, including the larger values of $B_LT$. For a given loop bandwidth, loops with larger $B_LT$ exhibited a considerably better (larger) mean time to first cycle slip than those with smaller $B_LT$ values. Loop performance has been assessed on the basis of steady-state phase error (SSPE). As $B_LT$ increases or a given value of $B_L$, SSPE is essentially constant or small $B_LT$ values (e.g., $B_LT \leq 0.02$) but increases for larger values of $B_LT$. Plots provide a measure of this "excess" SSPE for large $B_LT$ values for loops with phase and phase-rate feedback.

APPENDIX A. LOOP BANDWIDTH FROM LOOP CONSTANTS IN THE CONTINUOUS-UPDATE LIMIT

We wish to solve for loop bandwidth $$2B_L = \int_{-\infty}^{\infty} dv |H(v)|^2 \tag{A.1}$$

in terms of loop constants $\kappa_i$, where the transfer function is given by $$H(v) = \frac{\kappa_1(i2\pi v)^{N-1} + \kappa_2(i2\pi v)^{N-2} + \ldots + \kappa_N}{(i2\pi v)^N + \kappa_1(i2\pi v)^{N-1} + \kappa_2(i2\pi v)^{N-2} + \ldots + \kappa_N} \tag{A.2}$$

Under the change of variable $u=2\pi v$, we have $$H(\mu) = \frac{\kappa_1(iu)^{N-1} + \kappa_2(iu)^{N-2} + \ldots + \kappa_N}{(iu)^N + \kappa_1(iu)^{N-1} + \kappa_2(iu)^{N-2} + \ldots + \kappa_N} \tag{A.3}$$

$$4\pi B_L = \int_{-\infty}^{\infty} du |H(u)|^2 = \int_{-\infty}^{\infty} du H^*(u) H(u) \tag{A.4}$$

From Gradshteyn & Ryzhik (3.112) (I. S. Gradshteyn and I. M. Ryzhik, Table of Integrals, Series and Products, Corrected and Enlarged Edition, Academic Press, New York, P. 218 (1980), we have $$\int_{-\infty}^{\infty} du \frac{g_N(u)}{h_N(u)h_N(-u)} = \frac{i\pi}{a_0} \frac{M_N}{\Delta_N} \tag{A.5}$$

where $$g_N(u) = b_1 u^{2(N-1)} + b_2 u^{2(N-2)} + \ldots + b_N \tag{A.6}$$

$$h_N(u) = a_0 u^N + a_1 u^{N-1} + \ldots + a_N \tag{A.7}$$

and $$\Delta_N = \begin{vmatrix} a_1 & a_3 & a_5 & \ldots & 0 \\ a_0 & a_2 & a_4 & \ldots & 0 \\ 0 & a_1 & a_3 & \ldots & 0 \\ . & . & . & & . \\ . & . & . & & . \\ . & . & . & & . \\ 0 & 0 & 0 & \ldots & a_N \end{vmatrix} \quad (A.8)$$

$$M_N = \begin{vmatrix} b_1 & b_2 & b_3 & \ldots & b_N \\ a_0 & a_2 & a_4 & \ldots & 0 \\ 0 & a_1 & a_3 & \ldots & 0 \\ . & . & . & & . \\ . & . & . & & . \\ . & . & . & & . \\ 0 & 0 & 0 & \ldots & a_N \end{vmatrix} \quad (A.9)$$

Comparing Equations (A.3) and (A.4) with (A.5), we get an expression for $g_N(u)$:

$$\begin{aligned} g_N(u) &= [\kappa_1(iu)^{N-1} + \kappa_2(iu)^{N-2} + \ldots + \kappa_N] \quad (A.10) \\ &\quad [\kappa_1(-iu)^{N-1} + \kappa_2(-iu)^{N-2} + \ldots + \kappa_N] \\ &= \sum_{j=1}^{N} u^{(N-j)} \left[ \kappa_j^2 + 2 \sum_{k=1}^{\min(N-j, j-1)} (-1)^k \kappa_{j-k} \kappa_{j+k} \right] \end{aligned}$$

and an expression for $h_N(u)$:

$$h_N(u) = (+i)^N u^N + (+i)^{N-1} \kappa_1 u^{N-1} + (+i)^{N-2} \kappa_2 u^{N-2} + \ldots + \kappa_N \quad (A.11)$$

where the choice of $+i$ rather than $-i$ has been made to place the roots of $h_N(u)$ in the upper half-plane. Finally, by equating like terms in (A.6) with (A.10) and (A.7) with (A.11), we have the coefficients $a_j$ and $b_j$ in terms of the loop constants $\kappa_j$:

$$a_j = \begin{cases} (+i)^N, & \text{if } j = 0; \\ (+i)^{N-j} \kappa_j, & \text{otherwise.} \end{cases} \quad (A.12)$$

$$b_j = \kappa_j^2 + 2 \sum_{k=1}^{\min(N-j, j-1)} (-1)^k \kappa_{j-k} \kappa_{j+k} \quad (A.13)$$

one can now express loop bandwidth as a function of loop filter constants by combining (A.4) and (A.5) to obtain $$B_L = \frac{i}{4a_0} \frac{M_N}{\Delta_N} \quad (A.14)$$

where the right side is given by Equations (A.8) and (A.9) with the substitution of Equations (A.12), and (A.13).

Table 3-1 lists results of Equation (A.14) and presents $B_L$ as a function of $\kappa_i$ for the first four loop orders. The table also presents $B_L$ as a function of the $\alpha$'s after substitution of Equation (3.12).

APPENDIX B. ADAPTATION OF ANALYSIS TO LOOPS WITH COMPUTATION DELAY OF ONE UPDATE INTERVAL

The preceding DU analysis is based on a loop filter with no computation delay. Even though the analogous derivation for a loop filter with a computation delay of one update interval is in many ways a straightforward generalization, there are a few differences that are worth mentioning. In analogy with Equation (3.34), the loop equation for a loop with a computation delay of one update interval and phase and phase-rate feedback becomes $$\Delta\phi_{m,n+1} + K_1 \phi_{m,n-1} + K_2 \sum_{i=1}^{n-1} \phi_{m,i} + K_3 \sum_{i=1}^{n-1} \sum_{j=1}^{i} \phi_{m,j} + \ldots = \quad (B.1)$$

$$K_1 \phi_{n-1} + K_2 \sum_{i=1}^{n-1} \phi_i + K_3 \sum_{i=1}^{n-1} \sum_{j=1}^{i} \phi_j + \ldots$$

Based on this equation, we find in a fashion similar to Sections 3.3.1 through 3.3.3 that the closed-loop transfer function is given by $$\bar{H}(z) = \frac{D(z) - z(z-1)^N}{D(z)} \quad (B.2)$$

where the denominator is defined by $$D(z) \equiv z(z-1)^N + (z-1)^{N-1} K_1 + z(z-1)^{N-2} K_2 + z^2(z-1)^{N-3} K_3 + \ldots + z^{N-1} K_N \quad (B.3)$$

This polynomial has $N+1$ roots in contrast to the zero-computation-delay case in Equation (3.42) and can be represented by $$D(z) = (z-z_1)(z-z_2)(z-z_3) \ldots (z-z_{N+1}) = 0 \quad (B.4)$$

Upon expansion of $D(z)$, a constraint equation for the extra $(N+1)^{st}$ root comes from the coefficient of $z^N$ when Equations (B.3) and (B.4) are equated:

$$z_{N+1} = N - \sum_{i}^{N} z_i \quad (B.5)$$

Thus if roots $z_1, z_2, \ldots, z_N$ are designated as selectable roots, the $(N+1)^{st}$ dependent root is determined by this equation. As explained in Section 3.3.6, we are free to place the N selectable roots, as before, according to loop noise bandwidth, damping parameter and relative-magnitude parameter. The DU analysis of a computation-delay loop is otherwise parallel to the analysis for zero-computation-delay loop. The linear equations relating the loop constants to the independent roots are similar to Equations (3.49) through (3.53) and will not be shown here. Results for this implementation have been presented in the text.

TABLE 3-1

Loop Bandwidth from Loop Constants in the Continuous-update Limit $1^{st}$ order $$B_L = \frac{\kappa_1}{4}$$

$2^{nd}$ order $$B_L = \frac{\kappa_1^2 + \kappa_2}{4\kappa_1} = \frac{\kappa_1}{4}(1 + \alpha_2)$$

$3^{rd}$ order $$B_L = \frac{\kappa_1^2 \kappa_2 - \kappa_1 \kappa_3 + \kappa_2^2}{4(\kappa_1 \kappa_2 - \kappa_3)} = \frac{\kappa_1}{4} \frac{\alpha_2 - \alpha_3 + \alpha_2^2}{\alpha_2 - \alpha_3}$$

$4^{th}$ order $$B_L = \frac{\kappa_1^2 \kappa_2 \kappa_3 - \kappa_1 \kappa_3^2 - \kappa_1^3 \kappa_4 + \kappa_2^2 \kappa_3 - \kappa_1 \kappa_2 \kappa_4 - \kappa_3 \kappa_4}{4(\kappa_1 \kappa_2 \kappa_3 - \kappa_3^2 - \kappa_1^2 \kappa_4)} =$$

$$\frac{\kappa_1}{4} \frac{\alpha_2 \alpha_3 - \alpha_3^2 - \alpha_4 + \alpha_2^2 \alpha_3 - \alpha_2 \alpha_4 - \alpha_3 \alpha_4}{\alpha_2 \alpha_3 - \alpha_3^2 - \alpha_4}$$

TABLE 3-2

Loop Filter Constants in the Continuous-update Limit

1st order

$K_1 = 4B_L T$

2nd order

$K_1 = 4B_L T \dfrac{1}{1 + \alpha_2}$  $\qquad K_2 = \alpha_2 K_1^2$

Controlled-root:  $\alpha_2 = \dfrac{1 - \eta_1^2}{4}$

Standard:  $\alpha_2 = \dfrac{1}{r}$

3rd order

$K_1 = 4B_L T \dfrac{\alpha_2 - \alpha_3}{\alpha_2 - \alpha_3 + \alpha_2^2}$  $\qquad K_2 = \alpha_2 K_1^2 \qquad K_3 = \alpha_3 K_1^3$ Controlled-root:  $\alpha_2 = \dfrac{2\lambda_2 + (1 - \eta_1^2)}{(2 + \lambda_2)^2} \qquad \alpha_3 = \dfrac{\lambda_2(1 - \eta_1^2)}{(2 + \lambda_2)^3}$ Standard:  $\alpha_2 = \dfrac{1}{r} \qquad \alpha_3 = \dfrac{k}{r^2}$

4th order

$K_1 = 4B_L T \dfrac{\alpha_2 \alpha_3 - \alpha_3^2 - \alpha_4}{\alpha_2 \alpha_3 - \alpha_3^2 - \alpha_4 - \alpha_2 \alpha_4 - \alpha_3 \alpha_4 + \alpha_2^2 \alpha_3}$  $\qquad K_2 = \alpha_2 K_1^2 \qquad K_3 = \alpha_3 K_1^3 \qquad K_4 = \alpha_4 K_1^4$ Controlled-root:  $\alpha_2 = \dfrac{4\lambda_2 + (1 - \eta_1^2) + \lambda_2^2(1 - \eta_2^2)}{(2 + 2\lambda_2)^2} \qquad \alpha_3 = \dfrac{2\lambda_2(1 - \eta_1^2) + 2\lambda_2^2(1 - \eta_2^2)}{(2 + 2\lambda_2)^3} \qquad \alpha_4 = \dfrac{\lambda_2^2(1 - \eta_1^2)(1 - \eta_2^2)}{(2 + 2\lambda_2)^4}$ Standard:  $\alpha_2 = \dfrac{1}{r} \qquad \alpha_3 = \dfrac{k}{r^2} \qquad \alpha_4 = \dfrac{a}{r^3}$

TABLE 3-3

Loop-filter Constants for Typical Implementations in the Continuous-update Approximation

| | Loop constants | | | | Conventional parameters | | |
|---|---|---|---|---|---|---|---|
| | $K_1$ | $K_2$ ($\alpha_2 K_1^2$) | $K_3$ ($\alpha_3 K_1^3$) | $K_4$ ($\alpha_4 K_1^4$) | r ($1/\alpha_2$) | k ($\alpha_3 r^2$) | a ($\alpha_4 r^3$) |
| Supercritically damped: $\eta_i^2 = 0$, $\lambda_i = 1$, for all roots | | | | | | | |
| 1st Order | $4 B_L T$ | | | | | | |
| 2nd Order | $\dfrac{16}{5} B_L T$ | $\dfrac{1}{4} K_1^2$ | | | 4 | | |
| 3rd Order | $\dfrac{32}{11} B_L T$ | $\dfrac{1}{3} K_1^2$ | $\dfrac{1}{27} K_1^3$ | | 3 | $\dfrac{1}{3}$ | |
| 4th Order | $\dfrac{256}{93} B_L T$ | $\dfrac{3}{8} K_1^2$ | $\dfrac{1}{16} K_1^3$ | $\dfrac{1}{256} K_1^4$ | $\dfrac{8}{3}$ | $\dfrac{4}{9}$ | $\dfrac{2}{27}$ |
| Standard underdamped: $\eta_i^2 = -1$, $\lambda_i = 1$, for all roots | | | | | | | |
| 1st Order | $4 B_L T$ | | | | | | |
| 2nd Order | $\dfrac{8}{3} B_L T$ | $\dfrac{1}{2} K_1^2$ | | | 2 | | |
| 3rd Order | $\dfrac{60}{23} B_L T$ | $\dfrac{4}{9} K_1^2$ | $\dfrac{2}{27} K_1^3$ | | $\dfrac{9}{4}$ | $\dfrac{3}{8}$ | |

TABLE 3-3-continued

Loop-filter Constants for Typical Implementations
in the Continuous-update Approximation

| | Loop constants | | | | Conventional parameters | | |
|---|---|---|---|---|---|---|---|
| | $K_1$ | $K_2$ $(\alpha_2 K_1^2)$ | $K_3$ $(\alpha_3 K_1^3)$ | $K_4$ $(\alpha_4 K_1^4)$ | r $(1/\alpha_2)$ | k $(\alpha_3 r^2)$ | a $(\alpha_4 r^3)$ |
| 4$^{th}$ Order | $\frac{64}{27} B_L T$ | $\frac{1}{2} K_1^2$ | $\frac{1}{8} K_1^3$ | $\frac{1}{64} K_1^4$ | 2 | $\frac{1}{2}$ | $\frac{1}{8}$ |

TABLE 3-4

Loop Bandwidth from Loop Constants for Discrete-update Loops with
Phase and Phase-Rate Feedback and No Compoutation Delay 1$^{st}$ order $$B_L T = \frac{K_1}{2(2-K_1)}$$

2$^{nd}$ order $$B_L T = \frac{2K_1^2 + 2K_2 + K_1 K_2}{2K_1(4 - 2K_1 - K_2)}$$

3$^{rd}$ order $$B_L T = \frac{4K_1^2 K_2 - 4K_1 K_3 + 4K_2^2 + 2K_1 K_2^2 + 4K_1^2 K_3 + 4K_2 K_3 + 3K_1 K_2 K_3 + K_3^2 + K_1 K_3^2}{2(K_1 K_2 - K_3 + K_1 K_3)(8 - 4K_1 - 2k_2 - K_3)}$$

4$^{th}$ order $$B_L T = \frac{\left(\begin{array}{c} 8K_1^2 K_2 K_3 - 8K_1 K_3^2 - 8K_1^3 K_4 + 8K_2^2 K_3 - 8K_1 K_2 K_4 - 8K_3 K_4 + 4K_1 K_2^2 K_3 + 8K_1^2 K_3^2 + 8K_2 K_3^2 + 4K_1^2 K_2 K_4 + 8K_2^2 K_4 - \\ 20K_1 K_3 K_4 - 8K_4^2 + 6K_1 K_2 K_3^2 + 2K_3^3 + 14K_1^2 K_3 K_4 + 14K_2 K_3 K_4 + 4K_1 K_2^2 K_4 - 10K_1 K_4^2 + 11K_1 K_2 K_3 K_4 + \\ 2K_1 K_3^3 + 5K_3^2 K_4 + 7K_1^2 K_4^2 + 6K_2 K_4^2 + 5K_1 K_3^2 K_4 + 5K_1 K_2 K_4^2 + 4K_3 K_4^2 + 4K_1 K_3 K_4^2 + K_4^3 + K_1 K_4^3 \end{array}\right)}{2 \, (K_1 K_2 K_3 - K_3^2 - K_1^2 K_4 + K_1 K_3^2 + K_1 K_2 K_4 - 2K_3 K_4 + 2K11 K_3 K_4 - K_4^2 + K_1 K_4^2)(16 - 8K_1 - 4K_2 - 2K_3 - K_4)}$$

TABLE 3-5

Loop Filter Constants for a Discrete-update Loop with Phase
and Phase-rate Feedback and Supercritically-damped Response

| | 1st order | 2nd order | | 3rd order | | | 4th order | | | |
|---|---|---|---|---|---|---|---|---|---|---|
| $B_L T$ | $K_1$ | $K_1$ | $K_2$ | $K_1$ | $K_2$ | $K_3$ | $K_1$ | $K_2$ | $K_3$ | $K_4$ |
| | | | | No computation delay | | | | | | |
| 0.001 | 0.003992 | 0.003193 | 2.553e-06 | 0.002903 | 2.812e-06 | 9.084e-10 | 0.002747 | 2.833e-06 | 1.299e-09 | 2.234e-13 |
| 0.005 | 0.01980 | 0.01582 | 6.309e-05 | 0.01438 | 6.941e-05 | 1.118e-07 | 0.01361 | 6.989e-05 | 1.597e-07 | 1.369e-10 |
| 0.01 | 0.03922 | 0.03130 | 0.0002488 | 0.02845 | 0.0002733 | 8.778e-07 | 0.02692 | 0.000275 | 1.251e-06 | 2.138e-09 |
| 0.02 | 0.07692 | 0.06125 | 0.0009677 | 0.05567 | 0.001060 | 6.765e-06 | 0.05269 | 0.001065 | 9.617e-06 | 3.265e-08 |
| 0.03 | 0.1132 | 0.08993 | 0.002118 | 0.08174 | 0.002312 | 2.220e-05 | 0.07738 | 0.002321 | 0.0000312 | 1.578e-07 |
| 0.05 | 0.1818 | 0.1438 | 0.005576 | 0.1307 | 0.00605 | 9.485e-05 | 0.1237 | 0.006059 | 0.0001337 | 1.113e-06 |
| 0.075 | 0.2609 | 0.2051 | 0.01176 | 0.1864 | 0.01267 | 0.0002936 | 0.1766 | 0.01265 | 0.0004113 | 5.055e-06 |
| 0.1 | 0.3333 | 0.2607 | 0.01965 | 0.2369 | 0.02101 | 0.0006405 | 0.2245 | 0.02094 | 0.0008915 | 1.439e-05 |
| 0.15 | 0.4615 | 0.3572 | 0.03931 | 0.3248 | 0.04147 | 0.001847 | 0.3080 | 0.04113 | 0.002540 | 5.978e-05 |
| 0.2 | 0.5714 | 0.4379 | 0.06264 | 0.3983 | 0.06523 | 0.00378 | 0.3780 | 0.06443 | 0.005139 | 0.0001570 |
| 0.25 | 0.6667 | 0.5061 | 0.08835 | 0.4606 | 0.09089 | 0.006432 | 0.4375 | 0.08942 | 0.008652 | 0.0003222 |
| 0.3 | 0.7500 | 0.5643 | 0.1155 | 0.5139 | 0.1175 | 0.00976 | 0.4885 | 0.1152 | 0.01300 | 0.0005671 |
| 0.35 | 0.8235 | 0.6142 | 0.1436 | 0.5598 | 0.1444 | 0.01371 | 0.5327 | 0.1411 | 0.01808 | 0.0008996 |
| 0.4 | 0.8889 | 0.6575 | 0.1720 | 0.5998 | 0.1712 | 0.01821 | 0.5712 | 0.1668 | 0.02380 | 0.001325 |
| 0.45 | 0.9474 | 0.6952 | 0.2006 | 0.6348 | 0.1977 | 0.02321 | 0.6050 | 0.1920 | 0.03006 | 0.001844 |
| 0.5 | 1.0 | 0.7282 | 0.2291 | 0.6657 | 0.2235 | 0.02864 | 0.6349 | 0.2166 | 0.03679 | 0.002459 |
| 0.6 | | 0.7828 | 0.2851 | 0.7173 | 0.2732 | 0.04059 | 0.6852 | 0.2634 | 0.05133 | 0.003967 |
| 0.7 | | 0.8257 | 0.3394 | 0.7585 | 0.3196 | 0.05371 | 0.7258 | 0.3069 | 0.06692 | 0.005832 |
| 0.8 | | 0.8599 | 0.3915 | 0.7920 | 0.3629 | 0.06769 | 0.7590 | 0.3471 | 0.08318 | 0.008026 |
| 0.9 | | 0.8874 | 0.4414 | 0.8196 | 0.4030 | 0.0823 | 0.7865 | 0.3842 | 0.09983 | 0.01052 |
| 1. | | 0.9096 | 0.4890 | 0.8426 | 0.4402 | 0.09735 | 0.8097 | 0.4184 | 0.1167 | 0.01328 |
| 1.2 | | 0,9425 | 0.5779 | 0.8782 | 0.5065 | 0.1283 | 0.8462 | 0.4790 | 0.1503 | 0.01951 |
| 1.4 | | 0.9645 | 0.6588 | 0.9042 | 0.5636 | 0.1597 | 0.8734 | 0.5308 | 0.1832 | 0.02650 |

TABLE 3-5-continued

Loop Filter Constants for a Discrete-update Loop with Phase and Phase-rate Feedback and Supercritically-damped Response

| | 1st order | 2nd order | | 3rd order | | | 4th order | | | |
|---|---|---|---|---|---|---|---|---|---|---|
| $B_LT$ | $K_1$ | $K_1$ | $K_2$ | $K_1$ | $K_2$ | $K_3$ | $K_1$ | $K_2$ | $K_3$ | $K_4$ |
| 1.6 | | 0.9793 | 0.7328 | 0.9237 | 0.6130 | 0.191 | 0.8942 | 0.5754 | 0.2151 | 0.03410 |
| 1.8 | | 0.9889 | 0.8006 | 0.9386 | 0.6559 | 0.222 | 0.9106 | 0.6141 | 0.2457 | 0.04216 |
| 2. | | 0.9950 | 0.8631 | 0.9502 | 0.6935 | 0.2525 | 0.9236 | 0.6479 | 0.2749 | 0.05058 |
| 2.5 | | 1.0 | 1.0 | 0.9697 | 0.7689 | 0.3258 | 0.9466 | 0.7158 | 0.3419 | 0.07270 |
| 3. | | | | 0.9811 | 0.8248 | 0.3947 | 0.9612 | 0.7667 | 0.4011 | 0.09566 |
| 3.5 | | | | 0.9881 | 0.8672 | 0.4591 | 0.9710 | 0.8058 | 0.4533 | 0.1189 |
| 4. | | | | 0.9925 | 0.8997 | 0.5194 | 0.9778 | 0.8366 | 0.4996 | 0.1422 |
| 4.5 | | | | 0.9953 | 0.9248 | 0.576 | 0.9827 | 0.8613 | 0.5409 | 0.1652 |
| 5. | | | | 0.9971 | 0.9444 | 0.6291 | 0.9864 | 0.8814 | 0.5779 | 0.1879 |
| | | | | Computation delay = 1 update interval | | | | | | |
| 0.001 | 0.003976 | 0.003181 | 2.538e-08 | 0.002892 | 2.796e-06 | 9.015e-10 | 0.002737 | 2.816e-06 | 1.288e-09 | 2.211e-13 |
| 0.005 | 0.01942 | 0.01554 | 6.135e-05 | 0.01414 | 6.749e-05 | 1.077e-07 | 0.01339 | 6.795e-05 | 1.537e-07 | 1.306e-10 |
| 0.01 | 0.03779 | 0.03023 | 0.0002357 | 0.02752 | 0.0002588 | 8.165e-07 | 0.02606 | 0.0002604 | 1.163e-06 | 1.952e-09 |
| 0.02 | 0.07177 | 0.05734 | 0.0008737 | 0.05224 | 0.0009552 | 5.897e-06 | 0.04951 | 0.0009599 | 8.364e-06 | 2.745e-08 |
| 0.03 | 0.1027 | 0.08185 | 0.001832 | 0.07461 | 0.001993 | 1.809e-05 | 0.07076 | 0.002000 | 2.554e-05 | 1.231e-07 |
| 0.05 | 0.1571 | 0.1245 | 0.004476 | 0.1136 | 0.00482 | 7.032e-05 | 0.1078 | 0.004819 | 9.836e-05 | 7.611e-07 |
| 0.075 | 0.2148 | 0.1685 | 0.008742 | 0.1538 | 0.009282 | 0.0001955 | 0.1462 | 0.009237 | 0.0002700 | 3.007e-06 |
| 0.1 | | 0.2046 | 0.01371 | 0.1869 | 0.01433 | 0.0003895 | 0.1778 | 0.01420 | 0.0005309 | 7.609e-06 |
| 0.15 | | 0.2594 | 0.02487 | 0.2377 | 0.02515 | 0.0009724 | 0.2265 | 0.02467 | 0.001289 | 2.610e-05 |
| 0.2 | | | | 0.2740 | 0.03595 | 0.001784 | 0.2618 | 0.03495 | 0.002295 | 5.906e-05 |
| 0.25 | | | | 0.3000 | 0.04617 | 0.002793 | 0.2878 | 0.04452 | 0.003473 | 0.0001076 |
| 0.3 | | | | | | | 0.3071 | 0.05316 | 0.004765 | 0.0001722 |
| 0.35 | | | | | | | 0.3211 | 0.06074 | 0.006129 | 0.0002543 |

TABLE 3-6

Loop Filter Constants for a Discrete-update Loop with Phase and Phase-rate Feedback and Standard-underdamped Response

| | 1st order | 2nd order | | 3rd order | | | 4th order | | | |
|---|---|---|---|---|---|---|---|---|---|---|
| $B_LT$ | $K_1$ | $K_1$ | $K_2$ | $K_1$ | $K_2$ | $K_3$ | $K_1$ | $K_2$ | $K_3$ | $K_4$ |
| | | | | No computation delay | | | | | | |
| 0.001 | 0.003992 | 0.002661 | 3.545e-06 | 0.002603 | 3.016e-06 | 1.311e-09 | 0.002367 | 2.804e-06 | 1.661e-09 | 4.923e-13 |
| 0.005 | 0.01980 | 0.01319 | 8.752e-05 | 0.01290 | 7.437e-05 | 1.611e-07 | 0.01173 | 6.907e-05 | 2.037e-07 | 3.008e-10 |
| 0.01 | 0.03922 | 0.02609 | 0.0003448 | 0.02552 | 0.0002926 | 1.264e-06 | 0.02321 | 0.0002716 | 1.594e-06 | 4.693e-09 |
| 0.02 | 0.07692 | 0.05106 | 0.001338 | 0.04996 | 0.001133 | 9.720e-06 | 0.04545 | 0.001051 | 1.222e-05 | 7.147e-08 |
| 0.03 | 0.1132 | 0.07499 | 0.002922 | 0.07338 | 0.002469 | 3.156e-05 | 0.06679 | 0.002289 | 3.955e-05 | 3.447e-07 |
| 0.05 | 0.1818 | 0.1199 | 0.007658 | 0.1174 | 0.000445 | 0.0001355 | 0.1070 | 0.005966 | 0.0001687 | 2.420e-06 |
| 0.075 | 0.2609 | 0.1713 | 0.01607 | 0.1677 | 0.01345 | 0.0004177 | 0.1530 | 0.01243 | 0.0005159 | 1.093e-05 |
| 0.1 | 0.3333 | 0.2179 | 0.02670 | 0.2133 | 0.02226 | 0.0009073 | 0.1949 | 0.02054 | 0.001112 | 3.096e-05 |
| 0.15 | 0.4815 | 0.2991 | 0.05288 | 0.2929 | 0.04370 | 0.002595 | 0.2683 | 0.04022 | 0.003136 | 0.0001273 |
| 0.2 | 0.5714 | 0.3675 | 0.08345 | 0.3599 | 0.06842 | 0.005269 | 0.3305 | 0.06282 | 0.006285 | 0.0003313 |
| 0.25 | 0.6667 | 0.4258 | 0.1166 | 0.4171 | 0.09491 | 0.008901 | 0.3838 | 0.08697 | 0.01049 | 0.0006738 |
| 0.3 | 0.7500 | 0.4760 | 0.1511 | 0.4662 | 0.1222 | 0.01341 | 0.4299 | 0.1118 | 0.01562 | 0.001176 |
| 0.35 | 0.8235 | 0.5196 | 0.1862 | 9.5089 | 0.1496 | 0.01871 | 0.4701 | 0.1367 | 0.02156 | 0.001851 |
| 0.4 | 0.8889 | 0.5577 | 0.2213 | 0.5463 | 0.1768 | 0.02470 | 0.5056 | 0.1613 | 0.02817 | 0.002705 |
| 0.45 | 0.9474 | 0.5914 | 0.2561 | 0.5793 | 0.2034 | 0.03129 | 0.5370 | 0.1853 | 0.03534 | 0.003738 |
| 0.5 | | 0.6214 | 0.2902 | 0.6085 | 0.2294 | 0.03838 | 0.5650 | 0.2087 | 0.04296 | 0.00495 |
| 0.6 | | 0.6721 | 0.3560 | 0.6590 | 0.2788 | 0.05381 | 0.6128 | 0.2532 | 0.05920 | 0.007884 |
| 0.7 | | 0.7134 | 0.4181 | 0.6983 | 0.3247 | 0.07047 | 0.6521 | 0.2944 | 0.07632 | 0.01145 |
| 0.8 | | 0.7475 | 0.4763 | 0.7316 | 0.3671 | 0.08796 | 0.6848 | 0.3325 | 0.0939 | 0.01558 |
| 0.9 | | 0.7762 | 0.5306 | 0.7593 | 0.4061 | 0.1060 | 0.7124 | 0.3675 | 0.1116 | 0.02021 |
| 1. | | 0.8007 | 0.5813 | 0.7829 | 0.4421 | 0.1243 | 0.7360 | 0.3997 | 0.1293 | 0.02527 |
| 1.2 | | 0.8399 | 0.6727 | 0.8205 | 0.5059 | 0.1612 | 0.7743 | 0.4569 | 0.1639 | 0.03644 |
| 1.4 | | 0.8699 | 0.7524 | 0.8490 | 0.5603 | 0.1979 | 0.8038 | 0.5058 | 0.1971 | 0.04869 |
| 1.6 | | 0.8936 | 0.8223 | 0.8713 | 0.6072 | 0.2337 | 0.8272 | 0.5479 | 0.2286 | 0.06171 |
| 1.8 | | 0.9127 | 0.8839 | 0.8891 | 0.6478 | 0.2684 | 0.8461 | 0.5846 | 0.2582 | 0.07525 |
| 2. | | 0.9286 | 0.9385 | 0.9035 | 0.6832 | 0.3019 | 0.8618 | 0.6167 | 0.2860 | 0.08913 |
| 2.5 | | 0.9587 | 1.051 | 0.9297 | 0.7544 | 0.3802 | 0.8910 | 0.6817 | 0.3482 | 0.1245 |
| 3. | | 0.9827 | 1.134 | 0.9470 | 0.8076 | 0.4510 | 0.9111 | 0.7310 | 0.4013 | 0.1599 |
| 3.5 | | | | 0.9592 | 0.8485 | 0.5151 | 0.9256 | 0.7695 | 0.4470 | 0.1945 |
| 4. | | | | 0.9680 | 0.8805 | 0.5735 | 0.9366 | 0.8004 | 0.4967 | 0.2281 |
| 4.5 | | | | 0.9747 | 0.9061 | 0.6269 | 0.9452 | 0.8256 | 0.5213 | 0.2605 |
| 5. | | | | 0.9798 | 0.9267 | 0.6760 | 0.9520 | 0.8465 | 0.5519 | 0.2917 |

TABLE 3-6-continued

Loop Filter Constants for a Discrete-update Loop with Phase
and Phase-rate Feedback and Standard-underdamped Response

| | 1st order | 2nd order | | 3rd order | | | 4th order | | | |
|---|---|---|---|---|---|---|---|---|---|---|
| $B_L T$ | $K_1$ | $K_1$ | $K_2$ | $K_1$ | $K_2$ | $K_3$ | $K_1$ | $K_2$ | $K_3$ | $K_4$ |
| | | | | Computation delay = 1 update interval | | | | | | |
| 0.001 | 0.003976 | 0.00265 | 3.516e-06 | 0.002594 | 2.997e-06 | 1.299e-09 | 0.002358 | 2.784e-06 | 1.645e-09 | 4.859e-13 |
| 0.005 | 0.01942 | 0.01299 | 8.487e-05 | 0.01270 | 7.229e-05 | 1.549e-07 | 0.01155 | 6.717e-05 | 1.959e-07 | 2.862e-10 |
| 0.01 | 0.03779 | 0.02533 | 0.0003248 | 0.02474 | 0.0002769 | 1.170e-06 | 0.02252 | 0.0002573 | 1.478e-06 | 4.259e-09 |
| 0.02 | 0.07177 | 0.04827 | 0.001194 | 0.04709 | 0.001019 | 8.391e-06 | 0.04293 | 0.0009475 | 1.058e-05 | 5.935e-08 |
| 0.03 | 0.1027 | 0.06919 | 0.002479 | 0.06730 | 0.002121 | 2.554e-05 | 0.06164 | 0.001971 | 3.210d-05 | 2.636e-07 |
| 0.05 | 0.1571 | 0.1060 | 0.005937 | 0.1030 | 0.005094 | 9.769e-05 | 0.09425 | 0.004732 | 0.0001220 | 1.594e-06 |
| 0.075 | 0.2148 | 0.1448 | 0.01130 | 0.1401 | 0.009726 | 0.0002657 | 0.1285 | 0.009020 | 0.0003292 | 6.120e-06 |
| 0.1 | | 0.1775 | 0.01725 | 0.1709 | 0.01489 | 0.000518 | 0.1571 | 0.01379 | 0.0006363 | 1.503e-05 |
| 0.15 | | 0.2300 | 0.02963 | 0.2193 | 0.02572 | 0.001236 | 0.2021 | 0.02372 | 0.001494 | 4.860d-05 |
| 0.2 | | 0.2713 | 0.04155 | 0.2554 | 0.03630 | 0.002167 | 0.2360 | 0.03335 | 0.002579 | 0.0001037 |
| 0.25 | | 0.3071 | 0.05222 | 0.2833 | 0.04616 | 0.003232 | 0.2622 | 0.04227 | 0.003795 | 0.0001781 |
| 0.3 | | | | 0.3055 | 0.05518 | 0.004373 | 0.2832 | 0.05037 | 0.005075 | 0.0002685 |
| 0.35 | | | | 0.3242 | 0.06338 | 0.005530 | 0.3002 | 0.05766 | 0.006374 | 0.0003710 |
| 0.4 | | | | | | | 0.3143 | 0.06420 | 0.007664 | 0.0004821 |
| 0.45 | | | | | | | 0.3263 | 0.07006 | 0.008927 | 0.0005986 |

TABLE 3-7

Loop Filter Constants as Power Series in $B_LT$ in the Case of Phase and Phase-rate Feedback and No Computation Delay

| | $K_1$ | $\alpha_2 = \dfrac{K_2}{K_1^2}$ | $\alpha_3 = \dfrac{K_3}{K_1^3}$ | $\alpha_4 = \dfrac{K_4}{K_1^4}$ |
|---|---|---|---|---|
| | | Supercritically damped: $\eta_i^2 = 0, \lambda_4 = 1$, for all roots | | |
| 1st Order | $4B_LT - 8(B_LT)^2 + 16(B_LT)^3$ | | | |
| 2nd Order | $\dfrac{16}{5} B_LT - \dfrac{896}{125} (B_LT)^2 + \dfrac{46592}{3125} (B_LT)^3$ | $\dfrac{1}{4} + \dfrac{2}{5} B_LT - \dfrac{12}{125} (B_LT)^2$ | | |
| 3rd Order | $\dfrac{32}{11} B_LT - \dfrac{8704}{1331} (B_LT)^2 + \dfrac{19996672}{1449459} (B_LT)^3$ | $\dfrac{1}{3} + \dfrac{128}{297} B_LT - \dfrac{25600}{107811} (B_LT)^2$ | $\dfrac{1}{27} + \dfrac{32}{297} B_LT + \dfrac{11776}{323433} (B_LT)^2$ | |
| 4th Order | $\dfrac{256}{93} B_LT - \dfrac{4947968}{804357} (B_LT)^2 + \dfrac{9053300 3264}{6956883693} (B_LT)^3$ | $\dfrac{3}{8} + \dfrac{40}{93} B_LT - \dfrac{237440}{804357} (B_LT)^2$ | $\dfrac{1}{16} + \dfrac{5}{31} B_LT + \dfrac{4544}{268119} (B_LT)^2$ | $\dfrac{1}{256} + \dfrac{1}{62} B_LT + \dfrac{3976}{268119} (B_LT)^2$ |
| | | Standard underdamped: $\eta_i^2 = -1, \lambda_4 = 1$, for all roots | | |
| 1st Order | $4B_LT - 8(B_LT)^2 + 16(B_LT)^3$ | | | |
| 2nd Order | $\dfrac{8}{3} B_LT - \dfrac{160}{27} (B_LT)^2 + \dfrac{1024}{81} (B_LT)^3$ | $\dfrac{1}{2} + \dfrac{2}{3} B_LT - \dfrac{4}{9} (B_LT)^2$ | | |
| 3rd Order | $\dfrac{60}{23} B_LT - \dfrac{70200}{12167} (B_LT)^2 + \dfrac{78662000}{6436343} (B_LT)^3$ | $\dfrac{4}{9} + \dfrac{100}{207} B_LT - \dfrac{62800}{328509} (B_LT)^2$ | $\dfrac{2}{27} + \dfrac{40}{207} B_LT + \dfrac{15800}{985527} (B_LT)^2$ | |
| 4th Order | $\dfrac{64}{27} B_LT - \dfrac{100352}{19683} (B_LT)^2 + \dfrac{15092096}{14348907} (B_LT)^3$ | $\dfrac{1}{2} + \dfrac{4}{9} B_LT - \dfrac{2720}{6561} (B_LT)^2$ | $\dfrac{1}{8} + \dfrac{7}{27} B_LT - \dfrac{1328}{19683} (B_LT)^2$ | $\dfrac{1}{64} + \dfrac{1}{18} B_LT + \dfrac{200}{6561} (B_LT)^2$ |

TABLE 3-8

Loop Filter Constants as Power Series in $B_LT$ in the Case of Phase and Phase-rate Feedback and Computation Delay of One Update Interval

| | $K_1$ | $\alpha_2 \equiv \dfrac{K_2}{K_1^2}$ | $\alpha_3 \equiv \dfrac{K_3}{K_1^3}$ | $\alpha_4 \equiv \dfrac{K_4}{K_1^4}$ |
|---|---|---|---|---|
| | | Supercritically damped: $\eta_i^2 = 0, \lambda_i = 1$, for all roots | | |
| $1^{st}$ Order | $4B_LT - 24(B_LT)^2 + 208(B_LT)^3$ | | | |
| $2^{nd}$ Order | $\dfrac{16}{5} B_LT - \dfrac{2368}{125} (B_LT)^2 + \dfrac{421888}{3125} (B_LT)^3$ | $\dfrac{1}{4} + \dfrac{4}{5} B_LT - \dfrac{112}{125} (B_LT)^2$ | | |
| $3^{rd}$ Order | $\dfrac{32}{11} B_LT - \dfrac{67072}{3993} (B_LT)^2 + \dfrac{489447424}{4348377} (B_LT)^3$ | $\dfrac{1}{3} + \dfrac{256}{297} B_LT - \dfrac{164864}{107811} (B_LT)^2$ | $\dfrac{1}{27} + \dfrac{64}{297} B_LT + \dfrac{1024}{107811} (B_LT)^2$ | |
| $4^{th}$ Order | $\dfrac{256}{93} B_LT - \dfrac{4186112}{268119} (B_LT)^2 + \dfrac{234721116160}{2318961231} (B_LT)^3$ | $\dfrac{3}{8} + \dfrac{80}{93} B_LT - \dfrac{474880}{268119} (B_LT)^2$ | $\dfrac{1}{16} + \dfrac{10}{31} B_LT + \dfrac{12736}{89373} (B_LT)^2$ | $\dfrac{1}{256} + \dfrac{1}{31} B_LT + \dfrac{3488}{89373} (B_LT)^2$ |
| | | Standard underdamped: $\eta_i^2 = -1, \lambda_i = 1$, for all roots | | |
| $1^{st}$ Order | $4B_LT - 24(B_LT)^2 + 208(B_LT)^3$ | | | |
| $2^{nd}$ Order | $\dfrac{8}{3} B_LT - \dfrac{128}{9} (B_LT)^2 + \dfrac{21632}{243} (B_LT)^3$ | $\dfrac{1}{2} + \dfrac{2}{3} B_LT - \dfrac{68}{27} (B_LT)^2$ | | |
| $3^{rd}$ Order | $\dfrac{60}{23} B_LT - \dfrac{173800}{12167} (B_LT)^2 + \dfrac{575110000}{6436343} (B_LT)^3$ | $\dfrac{4}{9} + \dfrac{500}{621} B_LT - \dfrac{362600}{985527} (B_LT)^2$ | $\dfrac{2}{27} + \dfrac{200}{621} B_LT + \dfrac{362500}{985527} (B_LT)^2$ | |
| $4^{th}$ Order | $\dfrac{64}{27} B_LT - \dfrac{81920}{6561} (B_LT)^2 + \dfrac{117784576}{1594323} (B_LT)^3$ | $\dfrac{1}{2} + \dfrac{20}{27} B_LT - \dfrac{13984}{6561} (B_LT)^2$ | $\dfrac{1}{8} + \dfrac{4}{9} B_LT - \dfrac{1552}{2187} (B_LT)^2$ | $\dfrac{1}{64} + \dfrac{5}{54} B_LT - \dfrac{200}{6561} (B_LT)^2$ |

TABLE 4-1

Transient-free Initialization of DPLLs Based on APriori Information
For a loop filter specified by update interval T, computation
delay $n_c$ update intervals, constants $K_1, K_2, \ldots, K_N$ and input
signal phase known in the form $\phi(t) = \phi_n + \phi_n^{(1)}(t - t_n) + \ldots + \frac{1}{N!} \phi_n^{(N)}(t - t_n)^N$ at time $t_n$, loop sums and loop model phase $\phi_{m,n}$
are initialized at the end of the "phantom" $n^{th}$ interval as indicated.

1st Order

$$\delta\phi_{ss} = \frac{T}{K_1} \phi_n^{(1)}$$

2nd Order

$$\delta\phi_{ss} = \frac{T^2}{K_2} \phi_n^{(2)}$$

$$\sum_{i=1}^{n-n_c} \delta\phi_i = \frac{1}{K_2} \left( T\phi_n^{(1)} + \frac{T^2}{2} \phi_n^{(2)} - K_1 \delta\phi_{ss} \right)$$

3rd Order

$$\delta\phi_{ss} = \frac{T^3}{K_3} \phi_n^{(3)}$$

$$\sum_{i=1}^{n-n_c} \delta\phi_i = \frac{1}{K_3} (T^2 \phi_n^{(2)} - K_2 \delta\phi_{ss})$$

$$\sum_{i=1}^{n-n_c} \sum_{j=1}^{i} \delta\phi_j = \frac{1}{K_3} \left( T\phi_n^{(1)} + \frac{T^2}{2} \phi_n^{(2)} + \frac{T^3}{6} \phi_n^{(3)} - K_1 \delta\phi_{ss} - K_2 \sum_{i=1}^{n-n_c} \delta\phi_i \right)$$

4th Order

$$\delta\phi_{ss} = \frac{T^4}{K_4} \phi_n^{(4)}$$

$$\sum_{i=1}^{n-n_c} \delta\phi_i = \frac{1}{K_4} \left( T^3 \phi_n^{(3)} - \frac{T^4}{2} \phi_n^{(4)} - K_3 \delta\phi_{ss} \right)$$

$$\sum_{i=1}^{n-n_c} \sum_{j=1}^{i} \delta\phi_j = \frac{1}{K_4} \left( T^2 \phi_n^{(2)} - \frac{T^4}{12} \phi_n^{(4)} - K_2 \delta\phi_{ss} - K_s \sum_{i=1}^{n-n_c} \delta\phi_i \right)$$

$$\sum_{i=1}^{n-n_c} \sum_{j=1}^{i} \sum_{k=1}^{j} \delta\phi_k = \frac{1}{K_4} \left( T\phi_n^{(1)} + \frac{T^2}{2} \phi_n^{(2)} + \frac{T^3}{6} \phi_n^{(3)} + \frac{T^4}{24} \phi_n^{(4)} - K_1 \delta\phi_{ss} - K_2 \sum_{i=1}^{n-n_c} \delta\phi_i - K_3 \sum_{i=1}^{n-n_c} \sum_{j=1}^{i} \delta\phi_j \right)$$

For all orders:

$$\phi_{m,n} = \begin{cases} \phi_n - \delta\phi_{ss}, & \text{Atan extractor} \\ \phi_n - \text{Arcsin}(2\pi \delta\phi_{ss})/2\pi, & \text{Sin extractor} \end{cases}$$

Having thus disclosed a preferred mode of carrying out the invention, what is claimed is:

1. A method for implementing a digital phase-locked loop having discrete updates to loop parameters and a preselected loop order greater than 1 and characterized by preselected parameters for loop bandwidth, computation delay, update-interval damping and decay rate; the method comprising the steps of:

a) determining the roots for the characteristic equation of the loop from the preselected parameters;

b) determining the loop constants from the loop roots of step a); and c) implementing a digital loop filter incorporating the loop constants of step b) thereby meeting the requirements imposed by said preselected loop parameters.

2. The method recited in claim 1 wherein said digital phase-locked loop is of the type having immediate update for modifying feedback for the very next update interval.

3. The method recited in claim 1 wherein said digital phase-locked loop is of the type having delayed updates for modifying feedback for a subsequent update interval after the very next update interval.

4. A method for establishing the loop filter constants in a digital phase-locked loop of order greater than 1, with discrete updates to loop parameters and characterized by preselected parameters for loop bandwidth, computation delay, update-interval, damping and decay rate, the loop of the type having a numerically-controlled oscillator for generating counter-rotation phasors based upon phase-related feedback for complex multiplication of a digitized input signal, the loop of the type also having an accumulator of counter-rotated signal phasors and a residual phase extractor; the loop filter of the type estimating next phase rate and generating feedback for input to the numerically-controlled oscillator; the method comprising the steps of:

a) determining the roots for the characteristic equation of the loop from the preselected parameters;

b) determining the loop constants from the loop roots of step a); and c) implementing a digital loop filter incorporating the loop constants of said loop filter as determined in step b) thereby meeting the requirements imposed by said preselected loop parameters.

5. The method recited in claim 4 wherein said digital phase-locked loop is of the type having immediate update for modifying feedback for the very next update interval.

6. The method recited in claim 4 wherein said digital phase-locked loop is of the type having delayed updates for modifying feedback for a subsequent update interval after the very next update interval.

7. A method for implementing a digital phase-locked loop having discrete updates to loop parameters and a preselected loop order of 1 and characterized by preselected parameters for loop bandwidth, computation delay and update-interval; the method comprising the steps of:

a) determining the root for the characteristic equation of the loop from the preselected parameters;

b) determining the loop constant from the loop root of step a); and c) implementing a digital loop filter incorporating the loop constant of step b) thereby meeting the requirements imposed by said preselected loop parameters.

8. A method for establishing the loop filter constant in a digital phase-locked loop of order 1 with discrete updates to loop parameter and characterized by preselected parameters for loop bandwidth, computation delay and update-interval, the loop of the type having a numerically-controlled oscillator for generating counter-rotation phasors based upon phase-related feedback for complex multiplication of a digitized input signal, the loop of the type also having an accumulator of counter-rotated signal phasors and a residual phase extractor; the loop filter of the type estimating next phase rate and generating feedback for input to the numerically-controlled oscillator; the method comprising the steps of:

a) determining the root for the characteristic equation of the loop from the preselected parameters;

b) determining the loop constant from the loop root of step a); and c) implementing a digital loop filter incorporating the loop constant of said loop filter as determined in step b) thereby meeting the requirements imposed by said preselected loop parameters.

* * * * *